United States Patent
Shajii et al.

(10) Patent No.: US 8,999,104 B2
(45) Date of Patent: *Apr. 7, 2015

(54) SYSTEMS, METHODS AND APPARATUS FOR SEPARATE PLASMA SOURCE CONTROL

(75) Inventors: Ali Shajii, Weston, MA (US); Richard Gottscho, Dublin, CA (US); Souheil Benzerrouk, Hudson, NH (US); Andrew Cowe, Andover, MA (US); Siddharth P. Nagarkatti, Acton, MA (US); William R. Entley, Wakefield, MA (US)

(73) Assignee: Lam Research Corporation, Fremont, CA (US)

( * ) Notice: Subject to any disclaimer, the term of this patent is extended or adjusted under 35 U.S.C. 154(b) by 564 days.

This patent is subject to a terminal disclaimer.

(21) Appl. No.: 12/852,364

(22) Filed: Aug. 6, 2010

(65) Prior Publication Data

US 2012/0031876 A1 Feb. 9, 2012

(51) Int. Cl.
  *C23F 1/00* (2006.01)
  *H01J 37/32* (2006.01)
(52) U.S. Cl.
  CPC ..... *H01J 37/32449* (2013.01); *H01J 37/32422* (2013.01); *H01J 37/3266* (2013.01); *H01J 37/32669* (2013.01); *H01J 37/32816* (2013.01); *H01J 2237/334* (2013.01)
(58) Field of Classification Search
  CPC ............... H01J 37/32192; H01J 37/32623; H01J 37/32577; H01J 37/32669

USPC ............... 156/345.38, 41, 42, 48, 49, 345.3, 156/345.41, 345.46, 345.49, 345.48; 118/723 MA, 723 AN; 216/59, 68

See application file for complete search history.

(56) References Cited

U.S. PATENT DOCUMENTS

| | | | |
|---|---|---|---|
| 4,276,557 | A | 6/1981 | Levinstein et al. |
| 4,340,462 | A | 7/1982 | Koch |
| 5,108,778 | A | 4/1992 | Suzuki et al. |
| 5,183,990 | A | 2/1993 | Enyedy |
| 5,302,237 | A | 4/1994 | Larson et al. |
| 5,349,271 | A | 9/1994 | Van Os et al. |
| 5,505,780 | A | 4/1996 | Dalvie et al. |

(Continued)

FOREIGN PATENT DOCUMENTS

| | | |
|---|---|---|
| EP | 1 155 164 B1 | 7/2010 |
| JP | 61189642 A | 8/1986 |

(Continued)

OTHER PUBLICATIONS

PCT International Search Report—PCT/US2011/001175—dated Nov. 29, 2011 (2 pages).

(Continued)

*Primary Examiner* — Lan Vinh
(74) *Attorney, Agent, or Firm* — Martine Penilla Group, LLP

(57) ABSTRACT

A plasma source includes multiple ring plasma chambers, multiple primary windings, multiple ferrites and a control system. Each one of the primary windings is wrapped around an exterior one of the ring plasma chambers. Each one of the plurality of the ring plasma chamber passes through a respective portion of the plurality of ferrites. The control system is coupled to each of the ring plasma chambers. A system and method for generating and using a plasma are also described.

16 Claims, 25 Drawing Sheets

(56) References Cited

U.S. PATENT DOCUMENTS

| | | | |
|---|---|---|---|
| 5,620,524 A | 4/1997 | Fan et al. | |
| 5,904,780 A | 5/1999 | Tomoyasu | |
| 5,998,933 A | 12/1999 | Shun'ko | |
| 6,150,628 A | 11/2000 | Smith et al. | |
| 6,190,236 B1 | 2/2001 | Drill | |
| 6,335,293 B1 | 1/2002 | Luo et al. | |
| 6,337,460 B2 | 1/2002 | Kelkar et al. | |
| 6,388,226 B1 | 5/2002 | Smith et al. | |
| 6,392,351 B1 | 5/2002 | Shun'ko | |
| 6,432,260 B1* | 8/2002 | Mahoney et al. | 156/345.35 |
| 6,444,137 B1 | 9/2002 | Collins et al. | |
| 6,527,911 B1 | 3/2003 | Yen et al. | |
| 6,641,698 B2 | 11/2003 | Kabansky | |
| 6,755,150 B2 | 6/2004 | Lai et al. | |
| 6,761,804 B2 | 7/2004 | Perrin | |
| 6,825,618 B2 | 11/2004 | Pu et al. | |
| 6,830,652 B1 | 12/2004 | Ohmi et al. | |
| 6,836,073 B2 | 12/2004 | Matsushita | |
| 6,851,384 B2 | 2/2005 | Yuda et al. | |
| 6,855,906 B2* | 2/2005 | Brailove | 219/121.36 |
| 6,872,259 B2 | 3/2005 | Strang | |
| 6,924,455 B1 | 8/2005 | Chen et al. | |
| 6,936,546 B2 | 8/2005 | Robbins | |
| 6,962,644 B2 | 11/2005 | Paterson et al. | |
| 6,988,327 B2 | 1/2006 | Garcia et al. | |
| 7,069,937 B2 | 7/2006 | Garcia et al. | |
| 7,198,055 B2 | 4/2007 | Woods et al. | |
| 7,217,337 B2* | 5/2007 | Choi | 156/345.38 |
| 7,234,477 B2 | 6/2007 | De Lararios et al. | |
| 7,363,876 B2 | 4/2008 | Lai et al. | |
| 7,411,352 B2 | 8/2008 | Madocks | |
| 7,513,262 B2 | 4/2009 | Woods | |
| 7,645,495 B2 | 1/2010 | Dings et al. | |
| 7,785,672 B2 | 8/2010 | Choi et al. | |
| 7,895,970 B2 | 3/2011 | Honda et al. | |
| 8,056,503 B2 | 11/2011 | Kikuchi et al. | |
| 8,169,148 B2* | 5/2012 | Jeon et al. | 315/111.21 |
| 2001/0000104 A1 | 4/2001 | Li et al. | |
| 2001/0002582 A1 | 6/2001 | Dunham et al. | |
| 2001/0003271 A1 | 6/2001 | Otsuki | |
| 2001/0023741 A1 | 9/2001 | Collison et al. | |
| 2001/0047760 A1 | 12/2001 | Moslehi | |
| 2001/0051439 A1 | 12/2001 | Khan et al. | |
| 2002/0030167 A1 | 3/2002 | Liebert et al. | |
| 2002/0101167 A1* | 8/2002 | Shan et al. | 315/111.11 |
| 2002/0104821 A1 | 8/2002 | Bazylenko et al. | |
| 2002/0121345 A1 | 9/2002 | Chen et al. | |
| 2003/0015965 A1 | 1/2003 | Godyak | |
| 2003/0071035 A1* | 4/2003 | Brailove | 219/672 |
| 2003/0106647 A1 | 6/2003 | Koshiishi et al. | |
| 2003/0188685 A1 | 10/2003 | Wang et al. | |
| 2003/0213560 A1 | 11/2003 | Wang et al. | |
| 2004/0018320 A1 | 1/2004 | Nicolussi | |
| 2004/0027781 A1 | 2/2004 | Hanawa et al. | |
| 2004/0047720 A1 | 3/2004 | Lerner et al. | |
| 2004/0175953 A1 | 9/2004 | Ogle | |
| 2004/0231799 A1 | 11/2004 | Lee et al. | |
| 2004/0238123 A1 | 12/2004 | Becknell et al. | |
| 2004/0238124 A1 | 12/2004 | Nakamura | |
| 2005/0000655 A1 | 1/2005 | Wi | |
| 2005/0001556 A1 | 1/2005 | Hoffman et al. | |
| 2005/0103620 A1 | 5/2005 | Chistyakov | |
| 2005/0160985 A1 | 7/2005 | Brcka | |
| 2005/0184670 A1 | 8/2005 | Lacoste et al. | |
| 2005/0194100 A1 | 9/2005 | Or et al. | |
| 2006/0065623 A1 | 3/2006 | Guiney et al. | |
| 2006/0236931 A1 | 10/2006 | Singh et al. | |
| 2006/0289409 A1 | 12/2006 | Choi et al. | |
| 2007/0032081 A1 | 2/2007 | Chang et al. | |
| 2007/0081295 A1 | 4/2007 | Brillhart et al. | |
| 2007/0163440 A1 | 7/2007 | Kim et al. | |
| 2007/0212484 A1 | 9/2007 | Li | |
| 2007/0251642 A1 | 11/2007 | Bera et al. | |
| 2007/0277930 A1 | 12/2007 | Yokoyama et al. | |
| 2007/0289710 A1 | 12/2007 | Hudson et al. | |
| 2008/0020574 A1 | 1/2008 | Marakhtanov et al. | |
| 2008/0041820 A1 | 2/2008 | Tong et al. | |
| 2008/0099145 A1 | 5/2008 | Keller | |
| 2008/0110860 A1 | 5/2008 | Miller et al. | |
| 2008/0173237 A1 | 7/2008 | Collins et al. | |
| 2008/0179007 A1 | 7/2008 | Collins et al. | |
| 2008/0179546 A1 | 7/2008 | Lee et al. | |
| 2008/0286489 A1 | 11/2008 | Wang et al. | |
| 2008/0286697 A1 | 11/2008 | Verhaverbeke et al. | |
| 2008/0302652 A1 | 12/2008 | Entley et al. | |
| 2009/0015165 A1 | 1/2009 | Jeon et al. | |
| 2009/0025879 A1 | 1/2009 | Rauf et al. | |
| 2009/0061087 A1 | 3/2009 | Endo et al. | |
| 2009/0061542 A1 | 3/2009 | Patrick | |
| 2009/0066315 A1 | 3/2009 | Hu et al. | |
| 2009/0068849 A1 | 3/2009 | Endo et al. | |
| 2009/0109595 A1 | 4/2009 | Herchen et al. | |
| 2009/0200268 A1 | 8/2009 | Tappan et al. | |
| 2009/0200269 A1 | 8/2009 | Kadkhodayan et al. | |
| 2009/0218212 A1 | 9/2009 | Denpoh et al. | |
| 2009/0233384 A1 | 9/2009 | Foad et al. | |
| 2009/0242135 A1 | 10/2009 | Koshimizu et al. | |
| 2009/0250340 A1 | 10/2009 | Sasaki et al. | |
| 2009/0250443 A1 | 10/2009 | Kim | |
| 2009/0272492 A1 | 11/2009 | Katz et al. | |
| 2009/0275210 A1 | 11/2009 | Shanker et al. | |
| 2009/0277585 A1 | 11/2009 | Maebashi et al. | |
| 2009/0286333 A1 | 11/2009 | Kozasa et al. | |
| 2009/0286405 A1 | 11/2009 | Okesaku et al. | |
| 2009/0305509 A1 | 12/2009 | Stevenson et al. | |
| 2009/0321019 A1 | 12/2009 | Chen et al. | |
| 2009/0321249 A1 | 12/2009 | Chistyakov | |
| 2010/0008016 A1 | 1/2010 | Onate et al. | |
| 2010/0024729 A1 | 2/2010 | Cao et al. | |
| 2010/0065215 A1* | 3/2010 | Jeon et al. | 156/345.48 |
| 2010/0072172 A1 | 3/2010 | Ui et al. | |
| 2010/0116788 A1 | 5/2010 | Singh et al. | |
| 2010/0116790 A1 | 5/2010 | Spitzl | |
| 2010/0140223 A1* | 6/2010 | Tyler et al. | 216/67 |
| 2010/0147050 A1 | 6/2010 | Barth | |
| 2010/0319852 A1 | 12/2010 | Brillhart et al. | |
| 2011/0061687 A1 | 3/2011 | Mikhaylichenko et al. | |
| 2011/0075313 A1 | 3/2011 | Comendant | |
| 2011/0108524 A1 | 5/2011 | Dhindsa et al. | |
| 2011/0209663 A1 | 9/2011 | Endo et al. | |
| 2012/0142197 A1 | 6/2012 | Endo et al. | |
| 2013/0093443 A1 | 4/2013 | Patrick | |

FOREIGN PATENT DOCUMENTS

| | | |
|---|---|---|
| JP | 5166595 | 7/1993 |
| JP | 5144594 | 11/1993 |
| JP | 7183282 A | 7/1995 |
| JP | 2004296729 A | 10/2004 |
| KR | 663668 B | 1/2007 |
| KR | 2007079870 A | 8/2007 |
| RU | 2022917 | 11/1994 |
| RU | 2056702 | 3/1996 |
| RU | 2094961 | 10/1997 |
| WO | WO 01 36703 A1 | 5/2001 |

OTHER PUBLICATIONS

PCT International Search Report—PCT/US2011/001174 dated Dec. 6, 2011 (2 pages).

PCT International Search Report—PCT/US2011/01176 (dated Jan. 19, 2012) (4 pages).

Koretzky, E. Kuo, S.P.;Polytech, Univ., Farmingdale, NY, USA; Plasma Science, 1997 IEEE—Pub. Date May 19-22, 1997; On p. 284. NPL Bias, dated 2001.

PCT International Search Report—PCT/US2012/063987—dated Jan. 28, 2013.

PCT International Search Report—PCT/US2012/065080—dated Jan. 28, 2013.

PCT International Search Report—PCT/US2012/065122—dated Mar. 25, 2013.

PCT International Search Report—PCT/US2012/065333—dated Jan. 25, 2013.

(56) References Cited

OTHER PUBLICATIONS

PCT International Search Report—PCT/US2012/065677—dated Feb. 7, 2013.
PCT International Search Report—PCT/US2012/065684—dated Jan. 28, 2013.
PCT International Search Report—PCT/US2012/065949—dated Feb. 5, 2013.
PCT International Search Report—PCT/US2012/066467—dated Feb. 8, 2013.
Yamamoto, T. Ono, M. Takahashi, M. Ando, M. Goto, N.G. Yasaka, Y. Ishii, N.; Dept. of Electr. & Electron. Eng., Yamagata Univ. Yonezawa, Japan—Antennas and Propagation Society International Symposium, 2001, IEEE; Pub. Date: Jul. 8-13, 2001—vol. 3; pp. 712-715 vol. 3.

* cited by examiner

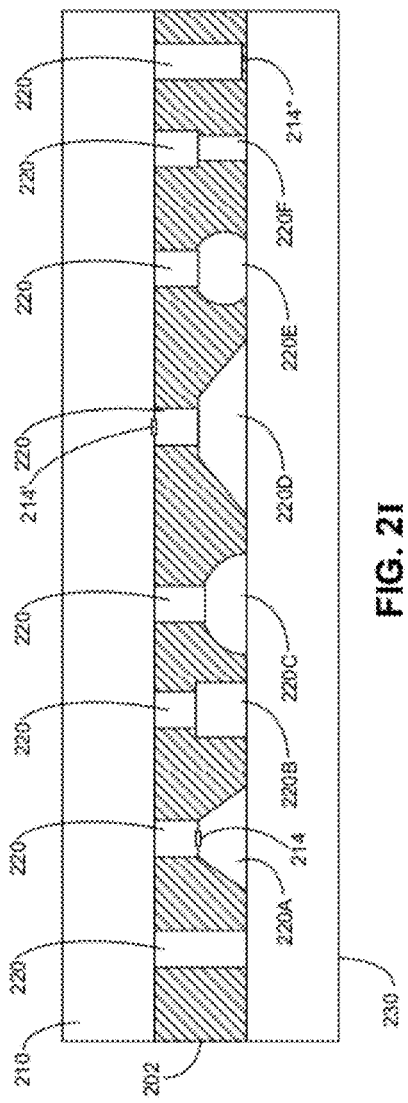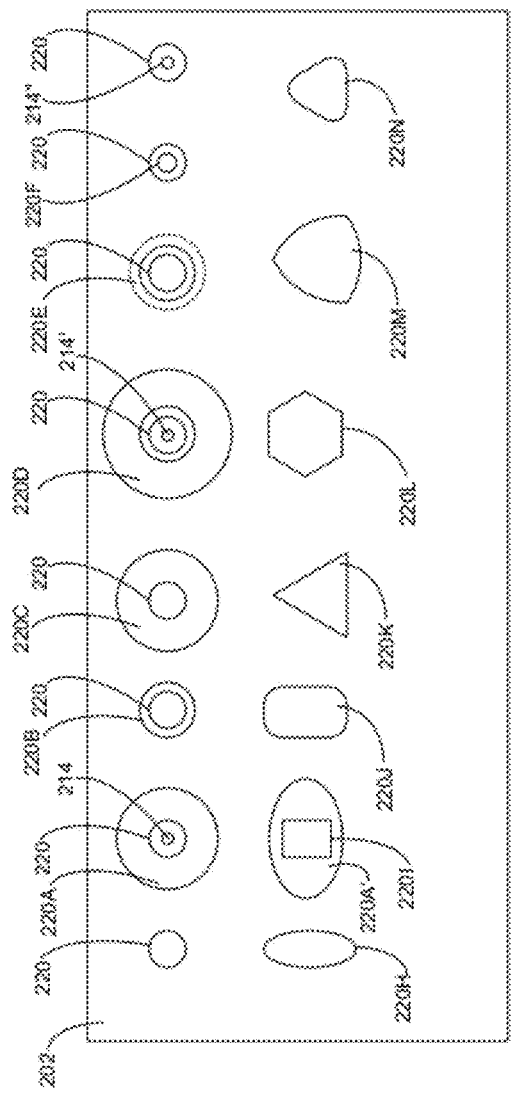

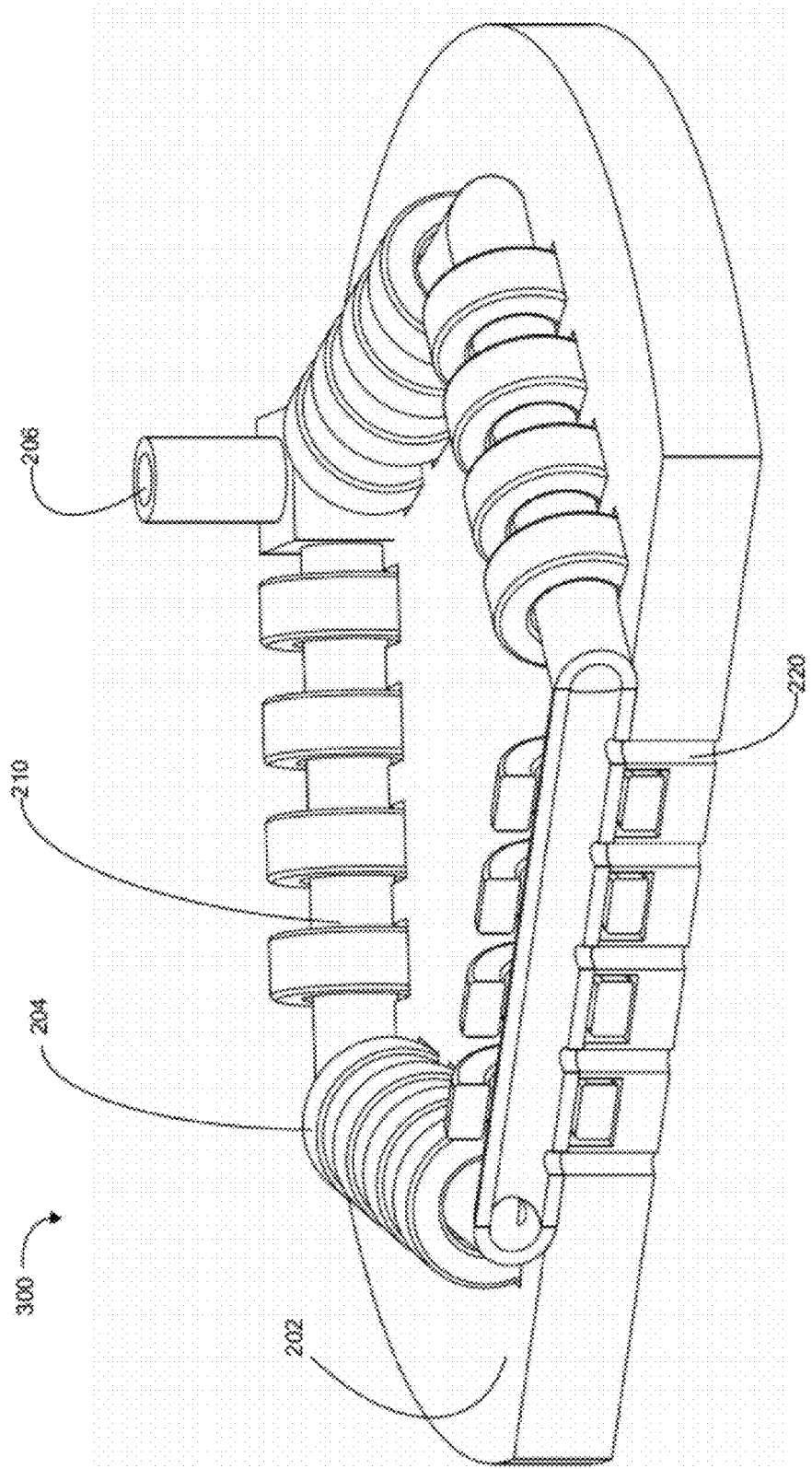

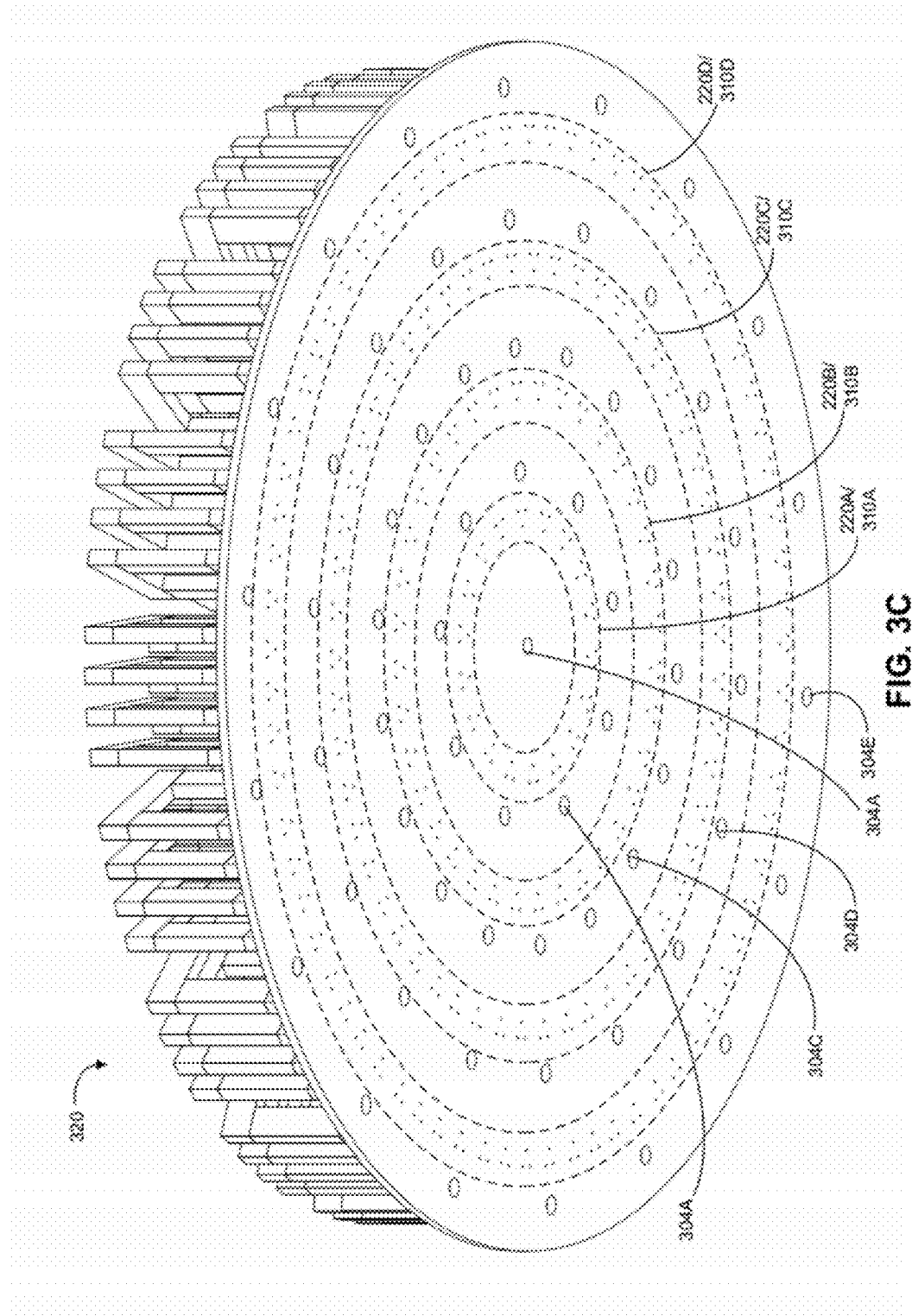

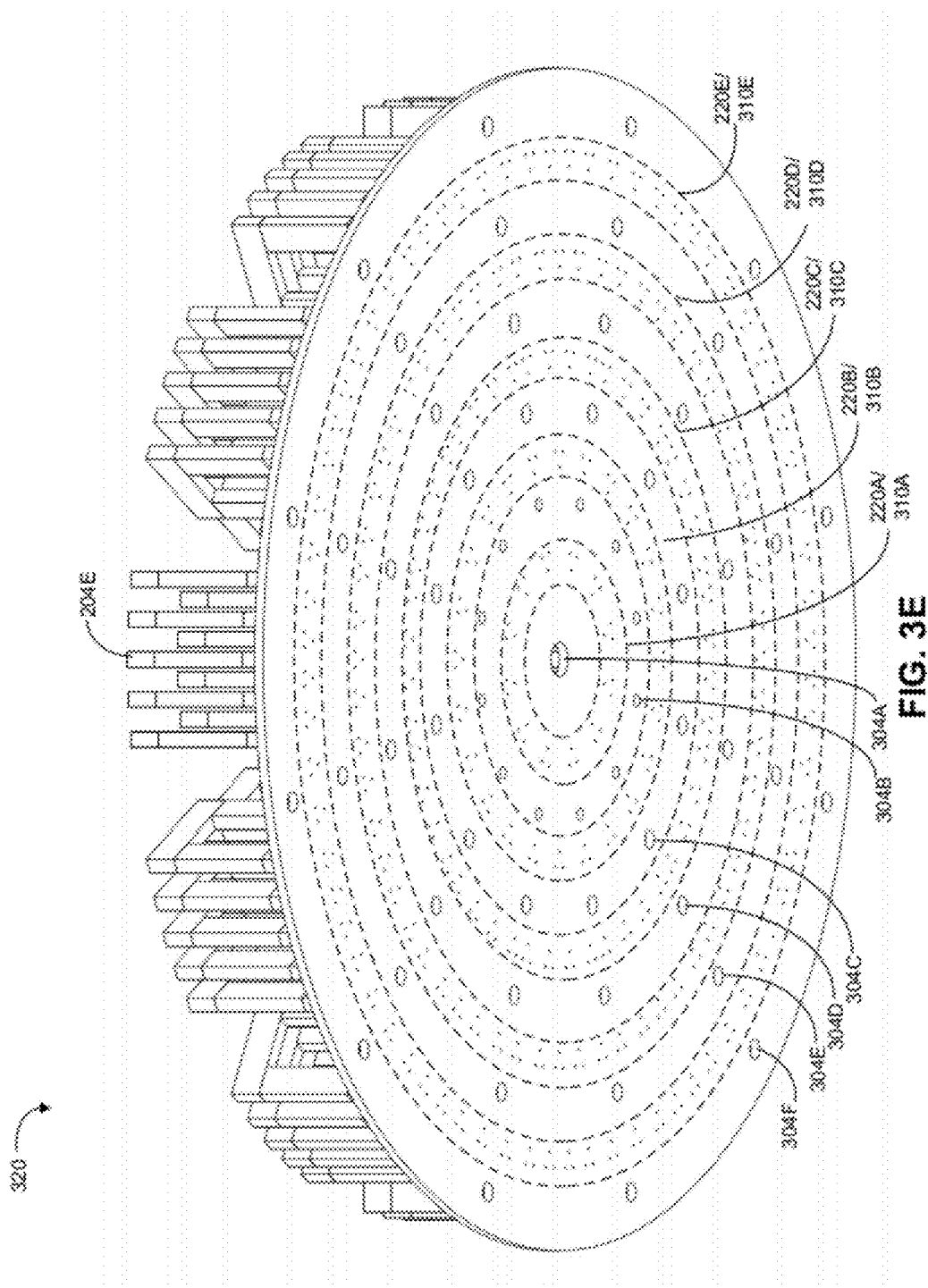

SYSTEMS, METHODS AND APPARATUS FOR SEPARATE PLASMA SOURCE CONTROL

BACKGROUND

The present invention relates generally to plasma reaction chambers, and more particularly, to methods, systems and apparatus for plasma reaction chambers separate from the wafer processing chamber.

FIG. 1A is a side view of a typical parallel-plate, capacitive, plasma processing chamber 100. FIG. 1B is a top view of a substrate 102 processed in the typical parallel-plate, capacitive, plasma processing chamber 100. The typical plasma processes processing chamber 100 includes a top electrode 104, a substrate support 106 for supporting a substrate to be processed 102. The substrate support 106 can also be a bottom electrode. The top electrode 104 is typically a showerhead type electrode with multiple inlet ports 109. The multiple inlet ports 109 allow process gases 110 in across the width of the processing chamber 100.

The typical parallel-plate, capacitive plasma reactor 100 is used for processing round planar substrates. Common processes are dielectric etch and other etch processes. Such plasma reactors typically suffer from inherent center-to-edge non-uniformities of neutral species.

Although these systems work well, some produce center-to-edge non-uniformities of neutral species which arise from the differences in one or more of a flow velocity, an effective gas residence time, and one or more gas chemistries present at the center of the substrate as compared to the flow velocity, effective gas residence time, and one or more gas chemistries present at the edge. The one or more gas chemistries can be caused by gas-phase dissociation, exchange and recombination reactions.

By way of example, as the process gases are introduced across the width of the processing chamber the plasma 112 is formed between the top electrode 104 and bottom electrode 106 and the plasma is formed. Plasma byproducts 118 are formed by the reaction of radicals and neutrals in the plasma 112 with the surface of the substrate 102. The plasma byproducts 118 are drawn off to the sides of the substrate and into pumps 108. Plasma byproducts can include one or more dissociation reactions (e.g., $CF4+e^- \rightarrow CF3+F+e^-$) and/or one or more ionizations (e.g., $CF4+e^- \rightarrow CF3^++F$) and/or one or more excitations (e.g., $Ar \rightarrow Ar^++e^-$) and/or one or more attachments (e.g., $CF4+e^- \rightarrow CF3+F^-$) and/or one or more binary reactions (e.g., $CF3+H \rightarrow CF2+HF$).

Plasma byproducts 118 can also include etch byproducts including the etchant, F, CFx, SiF2, SiF4, Co, CO2. Etch byproducts can also dissociate in the plasma 112.

Recombination also occurs during the plasma processing. Recombination produces recombination products 120. Recombination typically occurs when the radicals and neutrals from the plasma 112 impact surfaces such as the bottom surface of the top electrode 104. The recombination products 120 are then drawn off the side of the substrate 102 into pumps 108, similar to the plasma byproducts 118. Plasma recombination products 120 can include one or more wall or surface reactions (e.g., $F+CF \rightarrow CF2$, and/or $H+H \rightarrow H2$, and/or $O+O \rightarrow O2$, and/or $N+N \rightarrow N2$). Plasma recombination products 120 can also include deposition where CFx forms a polymer on the wall or other internal surface of the chamber 100.

It should be noted that as shown in FIG. 1A, the plasma byproducts are drawn off one side of the substrate 102 and the recombination products 120 are drawn off the opposite side of the substrate 102 for clarity purposes only. In actual practice, those skilled in the art would realize that both the recombination products 120 and the plasma byproducts 118 are intermixed and drawn off both sides of the substrate 102 to pumps 108 or other means.

As the plasma processing occurs, concentrations of the recombination products 120 and the plasma byproducts 118 vary from the center to the edge of the substrate 102. As a result, the concentrations of the process gases, radicals and neutral species in the plasma 112 also correspondingly vary. Thus, the effective plasma processing, etch in this instance, varies from the center to the edge of the substrate 102. There are, however, a number of chamber configurations and structures that can be implemented to reduce or control the plasma.

With such controls, the plasma radicals and neutral species are most concentrated at the center of the substrate 102 in plasma processing regions 114A and 116A over central portion 102A of the substrate 102. Further, the concentrations of the radicals and neutral species are somewhat less concentrated in intermediate plasma processing regions one 114B and 116B over intermediate portion 102B of the substrate 102. Further still, the concentrations of the radicals and neutral species are further diluted and less concentrated in edge plasma processing regions 114C and 116C over the edge portion 102C of the substrate 102.

Thus, plasma processing occurs fastest in the center plasma processing regions 114A and 116A over the center portion 102A of substrate 102 as compared to the plasma processing that occurs slightly slower in the intermediate plasma processing regions 114B and 116B over the intermediate portion 102B of substrate 102 and even slower in the plasma processing of the edge plasma processing regions 114C and 116C over the edge portion 102C of the substrate. This results in a center-to-edge nonuniformity of the substrate 102.

This center-to-edge nonuniformity is exacerbated in small volume product plasma processing chambers that have a very large aspect ratio. For example, a very large aspect ratio is defined as when the width W of the substrate is about four or more or more times the height H of the plasma processing region. The very large aspect ratio of the plasma processing region further concentrates the plasma byproducts 118 and recombination products 120 in the plasma processing regions 114A-116C.

Although this center-to-edge non-uniformity of neutral species is not the only cause of center-to-edge process uniformity, in many dielectric etch applications it is a significant contributor. Specifically, neutral-dependent processes such as gate or bitline mask open, photoresist strip over low-k films, highly selective contact/cell and via etch may be especially sensitive to these effects. Similar problems may apply in other parallel-plate plasma reactors, besides those used for wafer dielectric etch.

In view of the foregoing, there is a need for improving the center-to-edge uniformity in plasma etch processes.

SUMMARY

Broadly speaking, the present invention fills these needs by providing a distributed multi-zone plasma source. It should be appreciated that the present invention can be implemented in numerous ways, including as a process, an apparatus, a system, computer readable media, or a device. Several inventive embodiments of the present invention are described below.

One embodiment provides a plasma source that includes multiple ring plasma chambers, multiple primary windings and multiple ferrites. A control system can also be included. Each one of the primary windings is wrapped around an exterior one of the ring plasma chambers. Each one of the plurality of the ring plasma chamber passes through a respective portion of the plurality of ferrites. The control system is coupled to each of the ring plasma chambers.

The ring plasma chambers can be substantially concentric. Each one of the ring plasma chambers can be adjacent to at least another one of the ring plasma chambers. Each one of the plasma chambers can include a corresponding multiple plasma chamber outlets coupling each one of the plasma chambers to a process chamber.

The plasma chambers can be included in a process chamber top. The plasma source can also include at least one process gas inlet coupling a process gas source to each one of the plasma chambers.

Each one of the plasma chambers can include at least one process gas inlet, the least one process gas inlet coupled to a process gas source and a process gas plenum and multiple inlet ports coupled between the process gas plenum and the respective one of the plasma chambers. The inlet ports can be distributed around the circumference of each one of the plasma chambers.

The ferrites can be substantially evenly distributed around the circumference of the ring plasma chamber. Alternatively, the ferrites can be grouped in groups around the circumference of each of the ring plasma chambers.

The ring plasma chamber can be one of a group of shapes consisting of substantially round, substantially triangular, substantially rectangular, or substantially polygonal shape.

Another embodiment provides a method of generating a plasma. The method includes delivering a process gas into multiple ring plasma chambers, applying a primary current to a primary winding that is wound around an exterior of each one of the ring plasma chambers. A magnetic field is generated in the primary windings and the magnetic field is concentrated with multiple ferrites. Each of ring plasma chambers passes through a corresponding portion of the ferrites. A secondary current is induced in the process gas in each one of the ring plasma chambers. The secondary current generates a plasma in the process gas in each of the ring plasma chambers.

The method can also include delivering at least one of a neutral species and a radical species to a process chamber through multiple outlet ports in each one of the ring plasma chambers. The outlet ports coupling the ring plasma chambers to the process chamber.

The method can also include removing at least one of a plasma byproduct and a recombination product from the process chamber through outlets in a process chamber top. At least one of the outlets can be located in a substantially central location in the process chamber top.

Delivering the process gas into the ring plasma chambers can include inputting the process gas to at least one process gas inlet to each one of the ring plasma chambers. Delivering the process gas into the ring plasma chambers can also include modulating at least one of a flow rate, a pressure, a bias and/or an outlet port diameter of each one of the ring plasma chambers. The ferrites can be substantially evenly distributed around the circumference of each one of the plurality of ring plasma chambers.

The method can also include receiving a process feedback signal from at least one process monitoring sensor and adjusting at least one set point of a flow rate, a pressure, a bias and/or an outlet port diameter of each one of the plurality of ring plasma chambers.

Another embodiment provides a plasma processing system. The system including multiple ring plasma chambers, primary windings wrapped around an exterior each one of the ring plasma chambers and multiple plurality of ferrites. Each one of the ring plasma chambers passes through a respective portion of the ferrites. The system can also include a control system coupled to each of the ring plasma chambers. The control system can include at least one process monitoring sensor and logic for delivering a process gas into each one of the ring plasma chambers, logic for applying a primary current to a respective primary winding around a corresponding exterior of each one of the ring plasma chambers, logic for generating magnetic field in each of the primary windings, logic for concentrating the magnetic field with the ferrites, wherein the ferrites are grouped in groups around the circumference of each of the ring plasma chambers, logic for inducing a secondary current in the process gas in each of the plurality of ring plasma chambers, logic for generating a plasma in the process gas in each of the ring plasma chambers with the secondary current, logic for receiving a process feedback signal from at the least one process monitoring sensor and logic for adjusting at least one set point.

Yet another embodiment provides a plasma system for processing a substrate. The plasma system includes a process chamber having a base, multiple sidewalls, a substrate support proximate to the base, a chamber top interfaced with the sidewalls to enclose the process chamber, multiple ferrites and multiple primary windings. The ferrites are disposed over the chamber top, such that the ferrites are distributed over regions of the substrate support, the regions extending at least between an exterior portion of the substrate support and a center portion of the substrate support. The ferrites are grouped in multiple groups of one or more ferrites. Each one of the primary windings is wrapped around an exterior one of the groups of ferrites. The plasma system can also include a power supply for providing a current along the primary windings, the ferrites concentrating the current over the regions of the substrate support.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 2I shows multiple sectional views of the plasma chamber outlets, in accordance with embodiments of the present invention.

FIG. 2J is a process chamber view of multiple plasma chamber outlets, in accordance with embodiments of the present invention.

FIG. 3A is a perspective view of another plasma source, in accordance with an embodiment of the present invention.

FIG. 3C is a bottom perspective view of multizone plasma source, in accordance with an embodiment of the present invention.

FIG. 3E is a bottom perspective view of multizone plasma source, in accordance with an embodiment of the present invention.

DETAILED DESCRIPTION

Several exemplary embodiments for a distributed multizone plasma source system, method and apparatus will now be described. It will be apparent to those skilled in the art that the present invention may be practiced without some or all of the specific details set forth herein.

Figure 1A:
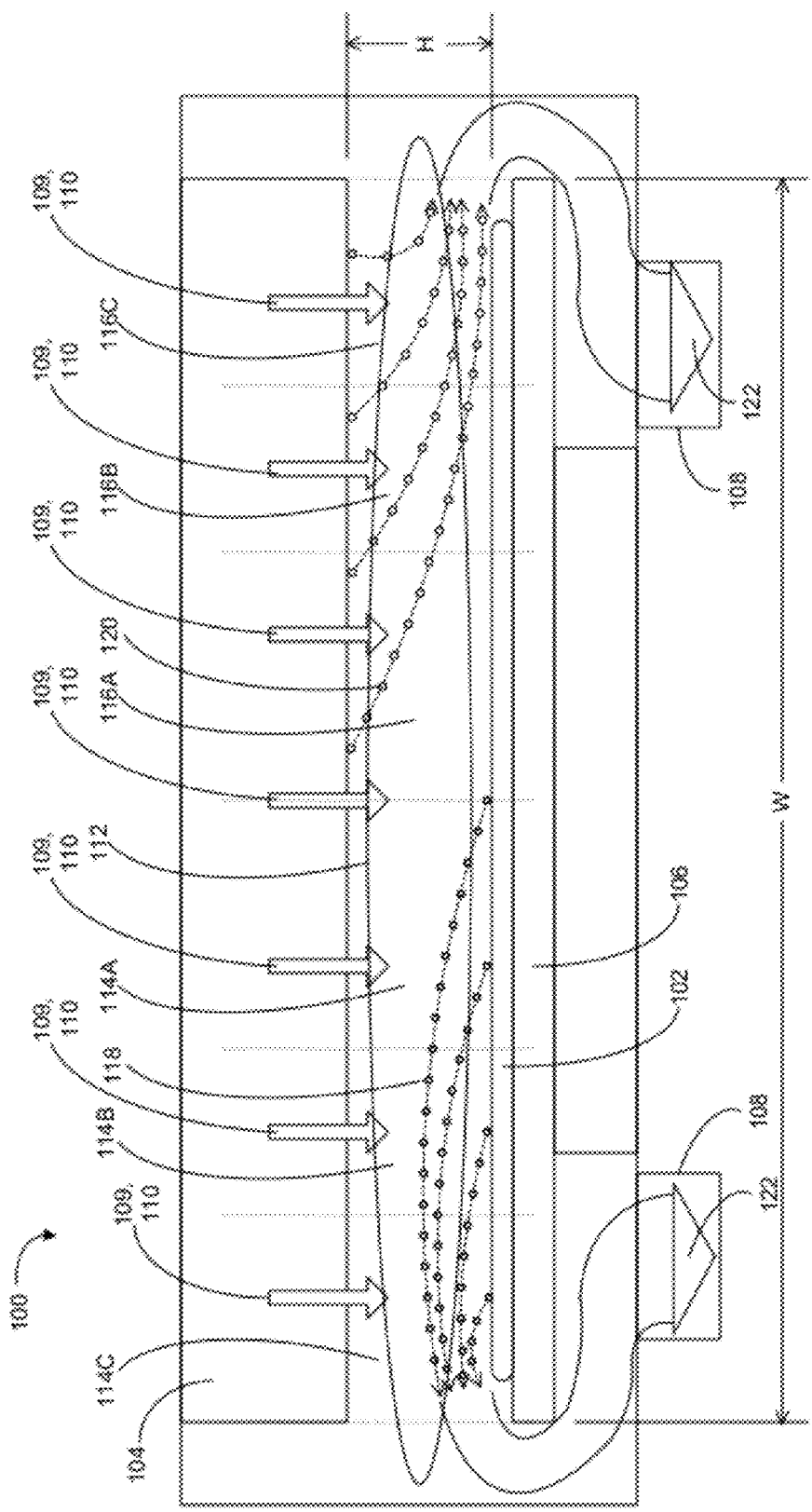
FIG. 1A is a side view of a typical parallel-plate, capacitive, plasma processing chamber.
Figure 1B:
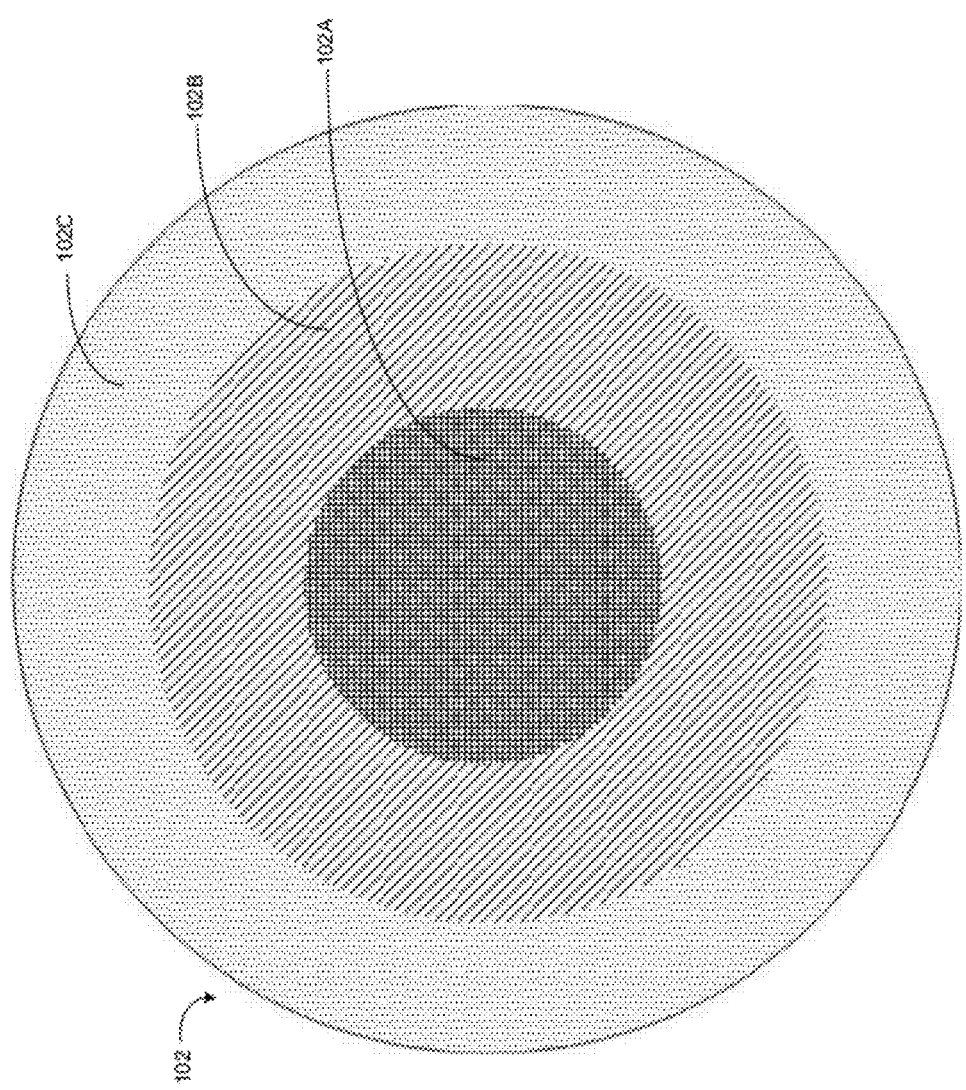
FIG. 1B is a top view of a substrate processed in the typical parallel-plate, capacitive, plasma processing chamber.
Figure 2A:
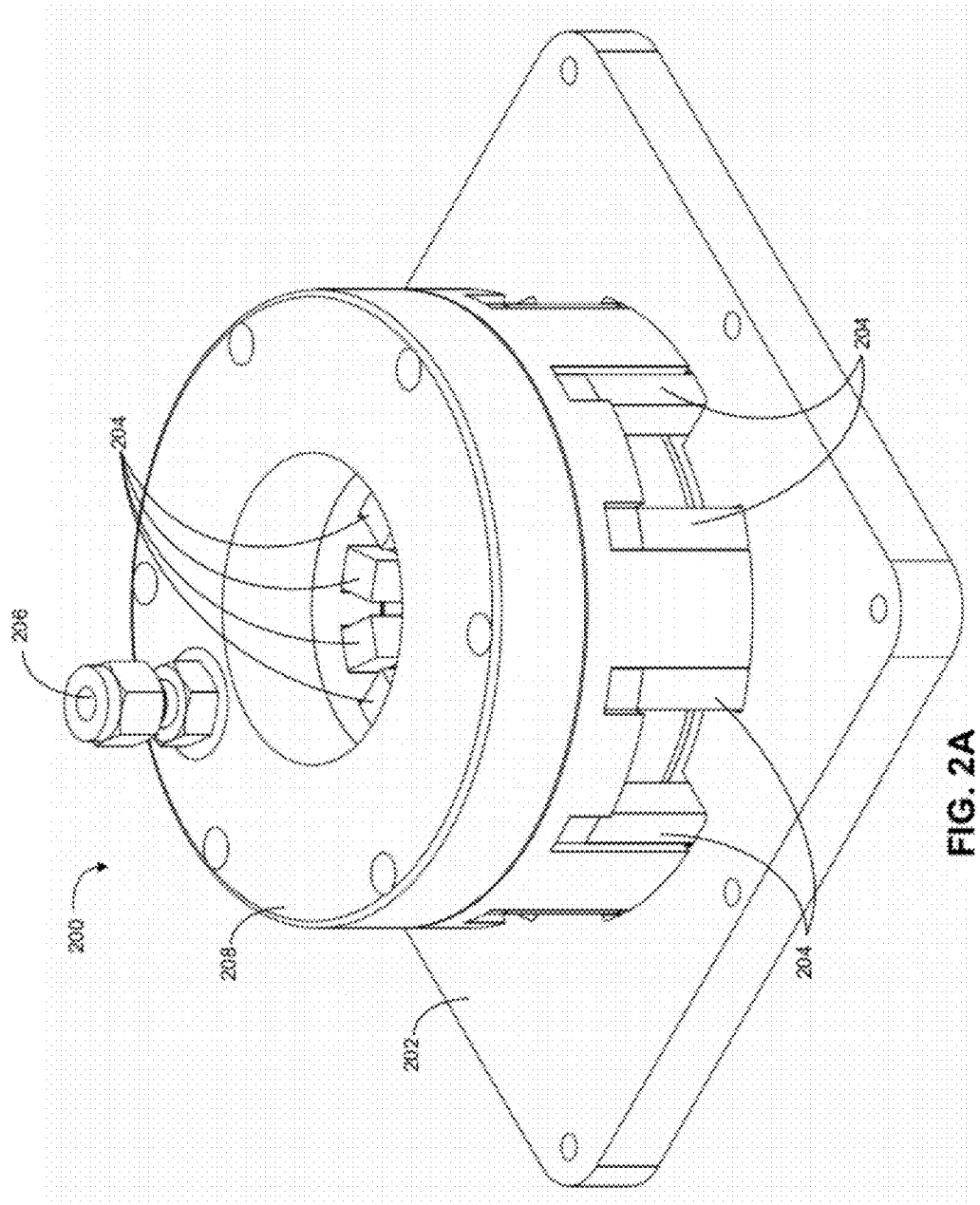
FIG. 2A is a perspective view of a plasma source, in accordance with an embodiment of the present invention.

FIG. 2A is a perspective view of a plasma source 200, in accordance with an embodiment of the present invention. The plasma source 200 includes a process gas inlet 206, multiple ferrites 204, a plasma source top 208 and a chamber top 202. It should be understood that the specific arrangement of the elements 202-208 of the plasma source 200 might be modified from what is shown. For example, the chamber top 202 and the plasma source top 208 could be combined into a single cover of the process chamber 230.

Figure 2B:
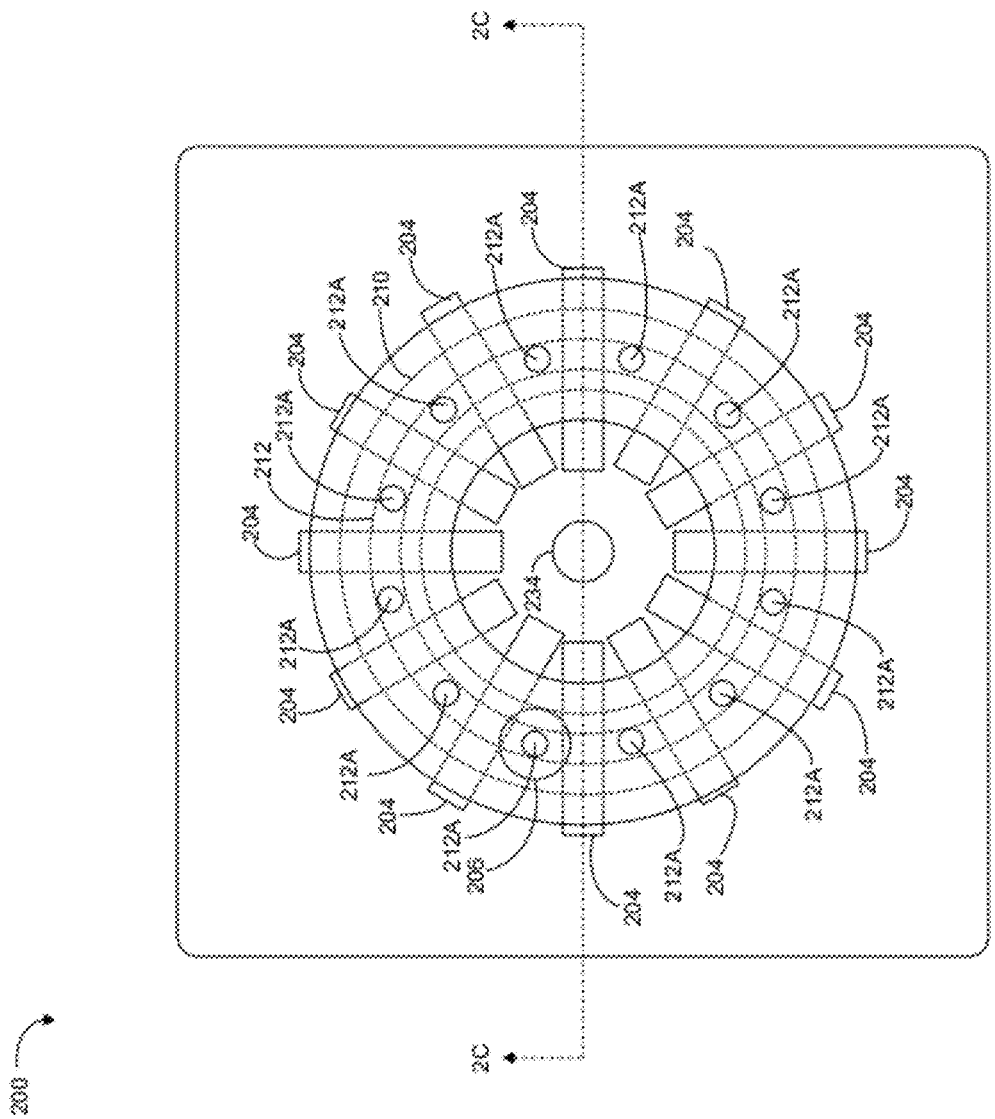
FIG. 2B is a top view of a plasma source, in accordance with an embodiment of the present invention.
Figure 2C:
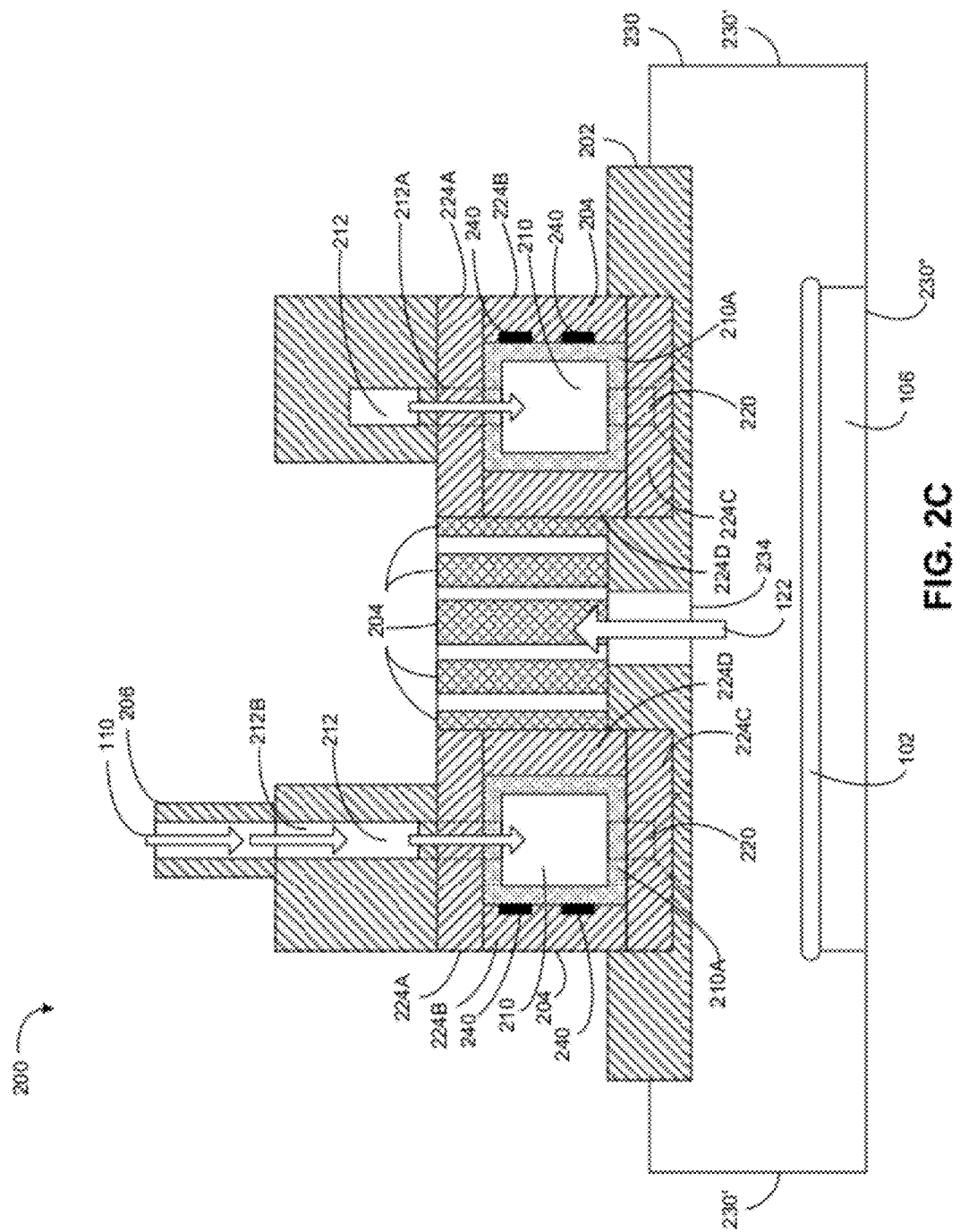
FIG. 2C is a sectional view 2C-2C of a plasma source, in accordance with an embodiment of the present invention.
Figure 2D:
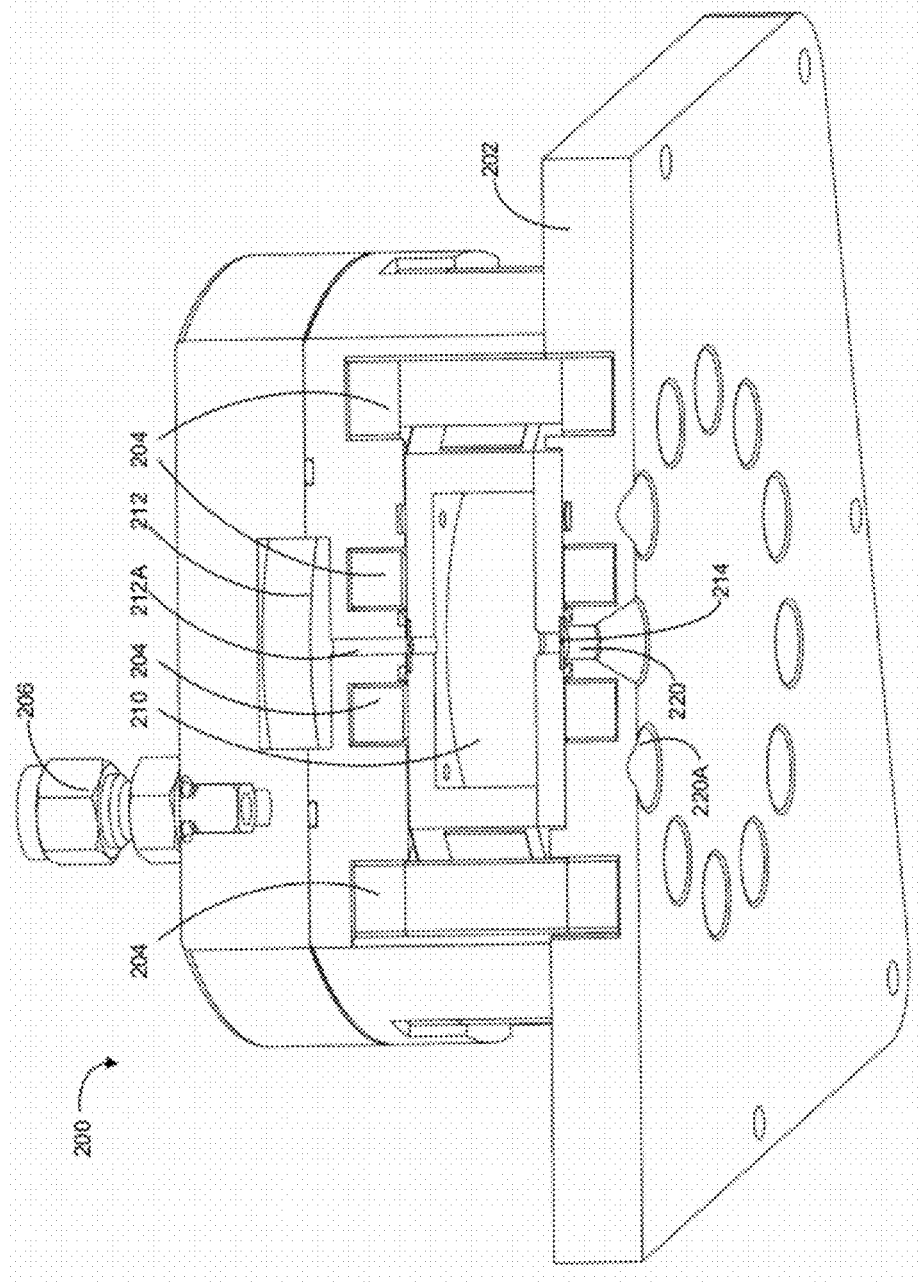
FIG. 2D is a perspective sectional view of a plasma source, in accordance with an embodiment of the present invention.
Figure 2E:
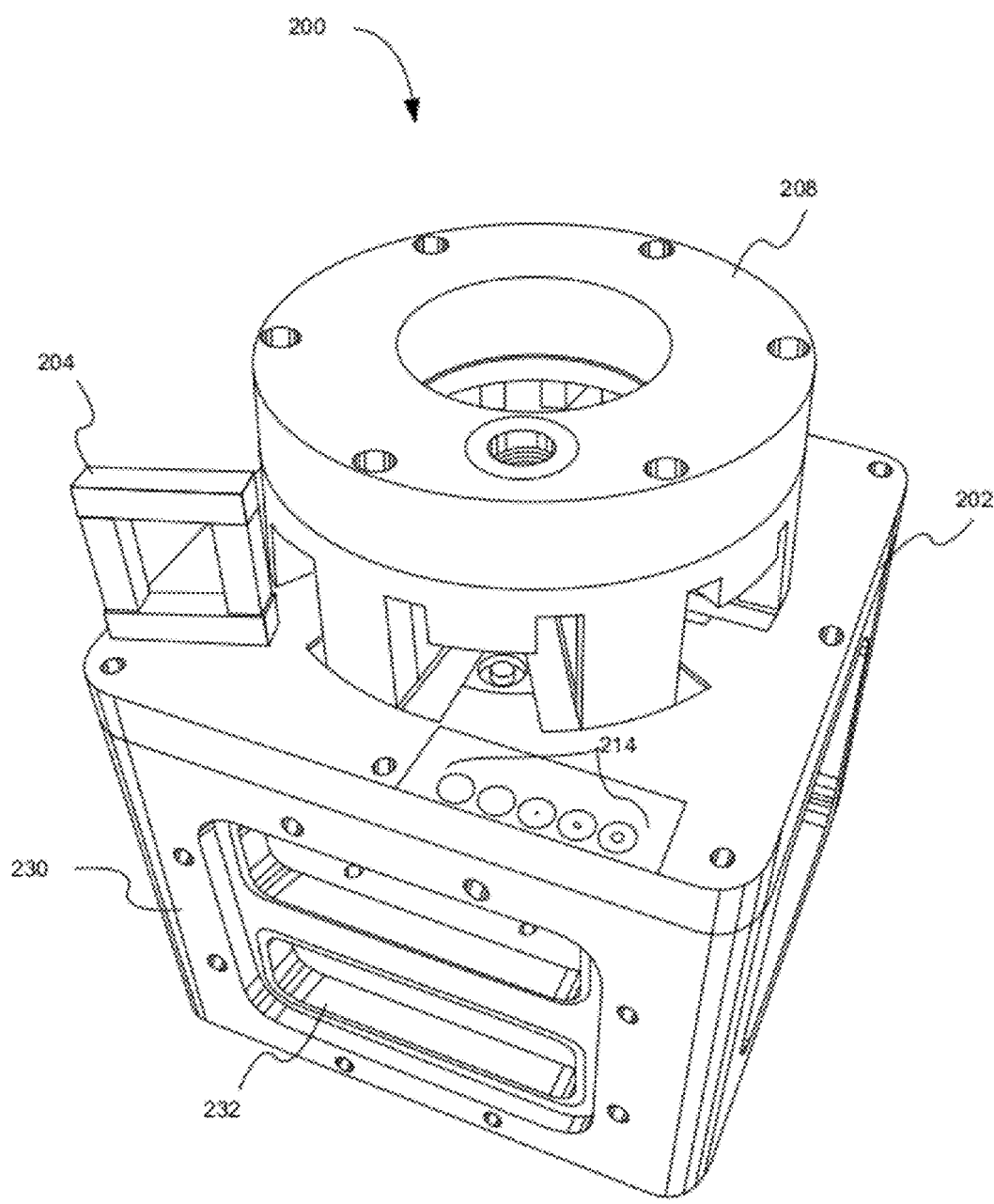
FIG. 2E is a perspective view of a plasma source mounted on a process chamber, in accordance with an embodiment of the present invention.

FIG. 2B is a top view of a plasma source 200, in accordance with an embodiment of the present invention. FIG. 2C is a sectional view 2C-2C of a plasma source 200, in accordance with an embodiment of the present invention. FIG. 2D is a perspective sectional view of a plasma source 200, in accordance with an embodiment of the present invention. FIG. 2E is a perspective view of a plasma source 200 mounted on a process chamber 230, in accordance with an embodiment of the present invention. A process gas plenum 212 is shown as a distributing plenum for the process gas supplied from the process gas inlet 206.

Process gas 110 flows into the inlet port 206 to the process gas plenum 212. The process gas plenum 212 distributes the process gas 110 to inlet ports 212A. The inlet ports 212A direct the process gas 110 into the plasma chamber 210. The process gas inlet ports 212A can be aligned with or offset from the plasma chamber outlets 220. The process gas inlet ports 212A and/or the plasma chamber outlets 220 can be located between the ferrites 204 or aligned with the ferrites or combinations thereof.

The ferrites 204 wrap around the plasma chamber 210 at selected intervals. The ferrites 204 concentrate the magnetic field sufficient to cause the electric field proximate to the center of each ferrite to be strong enough to support a plasma at a corresponding point in the plasma chamber 210.

The ferrites 204 are shown as being substantially square however, as will be shown below, the ferrites can be other shapes. The ferrites 204 are shown as being made in multiple parts 224A, 224B, 224C, 224D, however the ferrites can be in one or more parts. The multiple ferrite parts 224A, 224B, 224C, 224D are substantially close together as required to concentrate the electric field proximate to the center of each ferrite 204. The ferrites 204 are shown distributed about the chamber top 202. The process chamber 230 has sidewalls 230' and base 230". The substrate support 106 is on or near or proximate to the base 230".

Plasma chamber outlets 220 are shown coupling the plasma chamber 210 to the process chamber 230 below the chamber top 202. The plasma chamber outlets 220 deliver plasma and/or radical and/or neutral species from the plasma chamber 210 and into the process chamber 230.

An optional plasma restriction 214 is also shown. The optional plasma restriction 214 can be used to provide a desired pressure differential between the plasma chamber 210 and the process chamber 230. The optional plasma restriction 214 can also be small enough and/or be biased such that plasma is substantially prevented from passing from the plasma chamber 210 to the process chamber 230. In addition, the plasma restriction can be biased to extract ions from the plasma chamber 210 and draw the ions into the process chamber and then onto the wafer. By way of example the optional plasma restriction 214 can have a diameter that is less than or equal to twice a plasma sheath thickness and thus the plasma sheath can prevent the plasma from passing through the optional plasma restriction. The optional plasma restriction 214 can have a selected diameter between about 0.1 mm and about 2.0 mm (e.g., 0.1 mm, 0.2 mm, 0.5 mm, 1.0 mm, 2.0 mm) It should be noted that the aspect ratio of the optional plasma restriction 214 can be used to adjust the effectiveness of plasma restriction. By way of example, a higher aspect ratio (i.e., length/width) plasma restriction 214 can substantially restrict the plasma while having minimal impact on neutral or radical species transport. It should also be understood that larger diameter outlet orifices are can also be used. By way of example the optional plasma restriction 214 can be omitted and the effective restriction is the width of the plasma chamber outlets 220. The width of the plasma chamber outlets 220 can be substantially wide enough to allow a substantially equal pressure in both the plasma chamber 210 and the process chamber 230.

FIG. 2I shows multiple sectional views of the plasma chamber outlets 220, in accordance with embodiments of the present invention. FIG. 2J is a process chamber view of multiple plasma chamber outlets 220, in accordance with embodiments of the present invention. The plasma chamber outlets 220 can be a straight through, substantially cylindrical with a substantially rectangular, cross-sectional shape of the desired width. The plasma chamber outlets 220 can include an optional conical shape 220A. The optional conical shape 220A can provide flow smoothing and/or flow distribution from the plasma chamber outlets 220. The plasma chamber outlets 220 can also include other optional shapes. By way of example the plasma chamber outlets 220 can include a larger width of the same shape 220B or a smaller width of the same shape 220F. The plasma chamber outlets 220 can include an optional curved or bowl shaped outlet 220C, 220E. The optional curved or bowl shaped outlet 220C, 220E can have an opening at the widest point such as outlet 220C or at a narrower point less than the widest point such as outlet 220E. The optional conical shape can be a truncated conical shape 220D.

The optional plasma restriction can be located substantially central along the length of the outlet port 220 such as the optional plasma restriction 214. Alternatively, the optional plasma restriction can be located substantially at the plasma chamber 210 end of the outlet port 220 such as the optional plasma restriction 214'. Alternatively, the optional plasma restriction can be located substantially at the process chamber 230 end of the outlet port 220 such as the optional plasma restriction 214". It should be understood that the optional plasma restriction 214 can be located anywhere along the length of the outlet port 220 between the plasma chamber 210 end and the process chamber 230 end of the outlet port 220.

As shown in FIG. 2J, the plasma chamber outlet 220 can be any suitable shape. By way of example, substantially round 220, substantially elliptical 220H, substantially rectangular 220I, 220J, or other geometrical shapes (e.g., triangular 220K, polygon of any number of sides 220L). The plasma chamber outlet 220 can include substantially sharp edges 220I, 220K, 220L or substantially curved edges and/or sides 220J, 220M, 220N. Combination of shapes can also be included in the plasma chamber outlet 220. By way of example optional conical shape 220A can have a more elliptical shape 220A' rather than a substantially round shape 220A.

The chamber top 202 can also include one or more outlets 234. The outlets 234 are coupled to a lower pressure source (e.g., a vacuum pump). The outlets 234 allow the lower pressure source to withdraw the plasma byproducts 118 and recombination products 120 from near the center of the process chamber 230. As a result, the plasma byproducts 118 and recombination products 120 do not interfere with the plasma 410 and the neutral species 412 generated by the plasma in the process chamber.

The process chamber 230 includes load ports 232 and support structure for supporting the substrate to be processed. Other features may also be included in the process chamber 230 as are well known in the art.

Figure 2F:
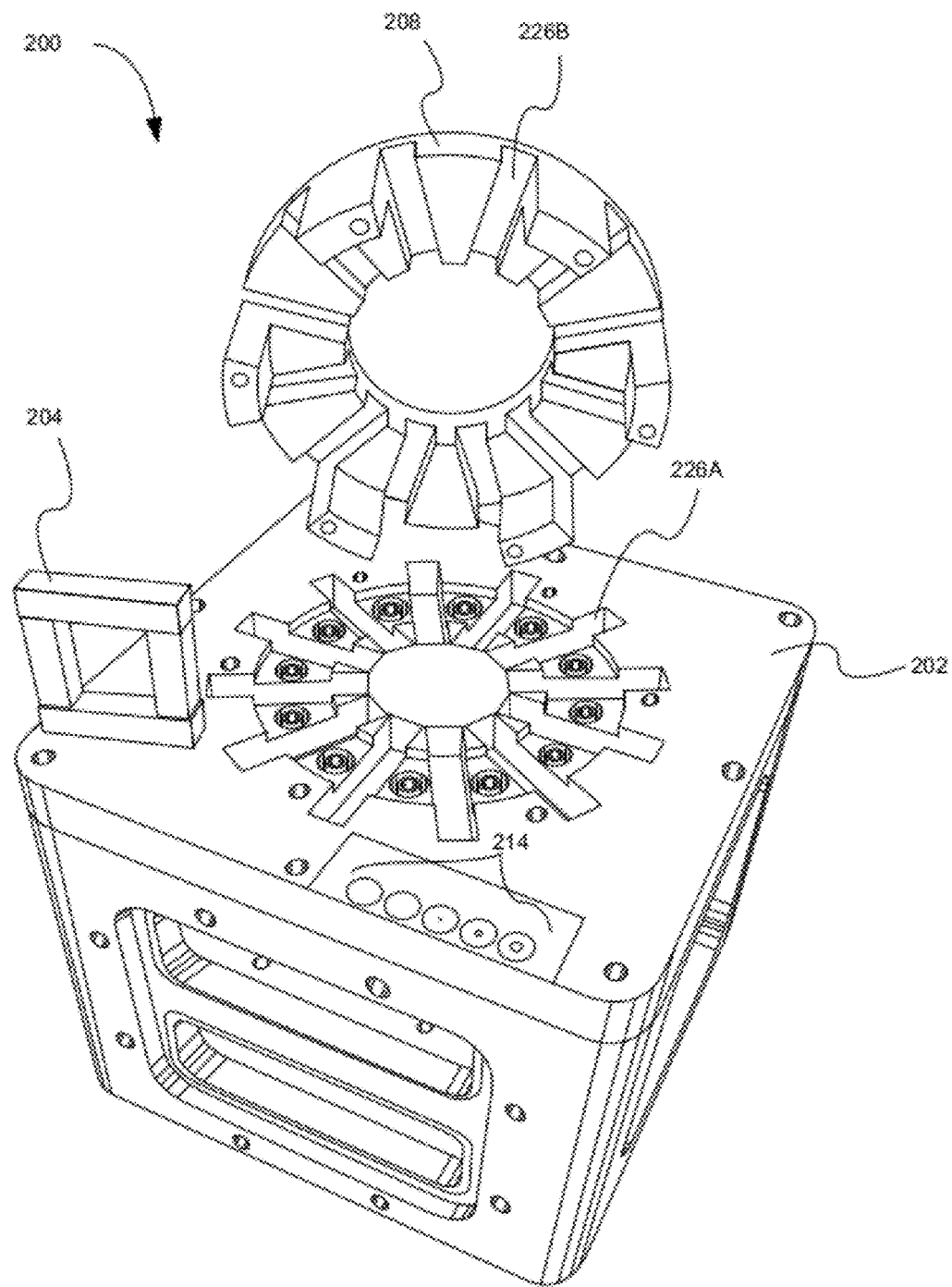
FIGS. 2F and 2G are additional perspective views of a plasma source 200 mounted on a process chamber, in accordance with an embodiment of the present invention.
Figure 2G:
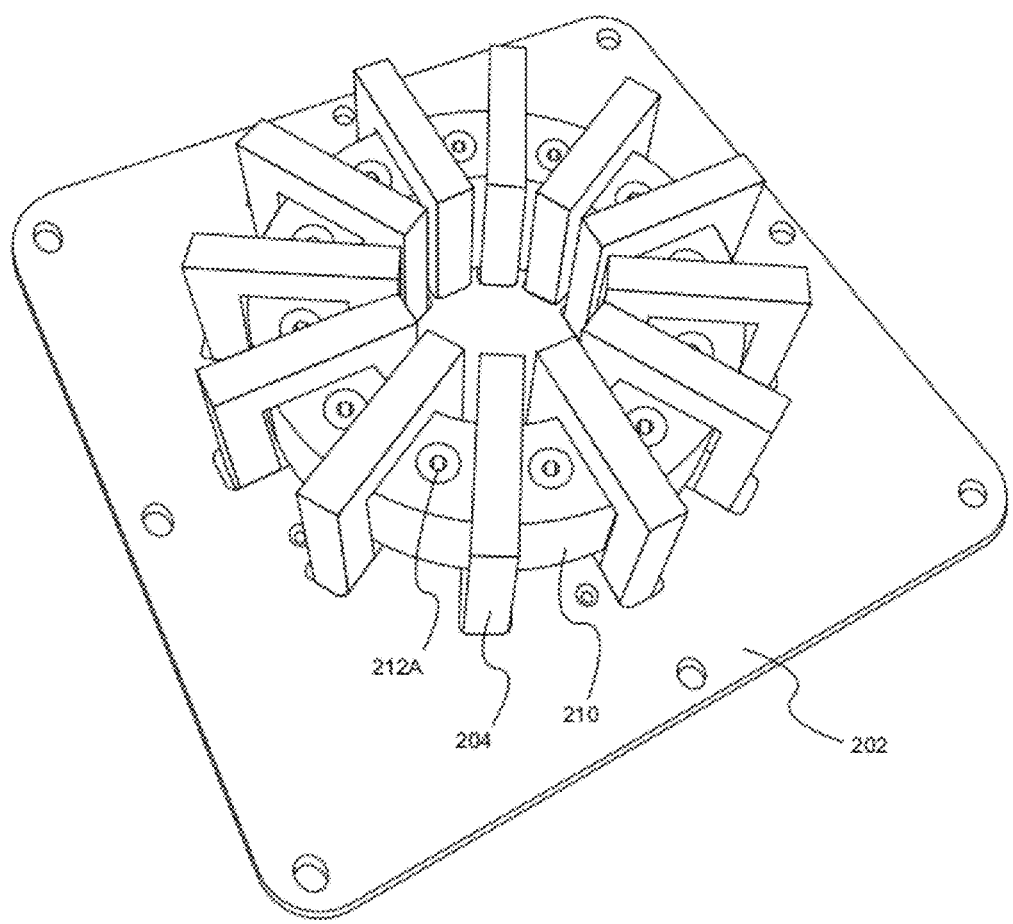

FIGS. 2F and 2G are additional perspective views of a plasma source 200 mounted on a process chamber 230, in accordance with an embodiment of the present invention. The plasma source top 208 is shown lifted (FIG. 2F) and removed (FIG. 2G) for description of additional details. The plasma chamber 210 can be constructed of a different material than the plasma source top 208 or the process chamber 230. By way of example, the plasma chamber 210 can be a ceramic and the plasma source top 208 or the process chamber 230 could be ceramic, metal (e.g., aluminum, steel, stainless steel, etc.) Slots 226A and 226B are provided for the support and installation of the ferrites 204.

As shown in FIG. 2G the ferrites 204 are shown wrapping around the exterior of plasma chamber 210. The plasma chamber 210 can be formed of a dielectric such as a ceramic or other dielectric material (e.g., quartz, silica ($SiO_2$), alumina ($Al_2O_3$), sapphire ($Al_2O_3$), aluminum nitride (AlN), yttrium oxide ($Y_2O_3$) and/or similar materials and combinations thereof).

Figure 2H:
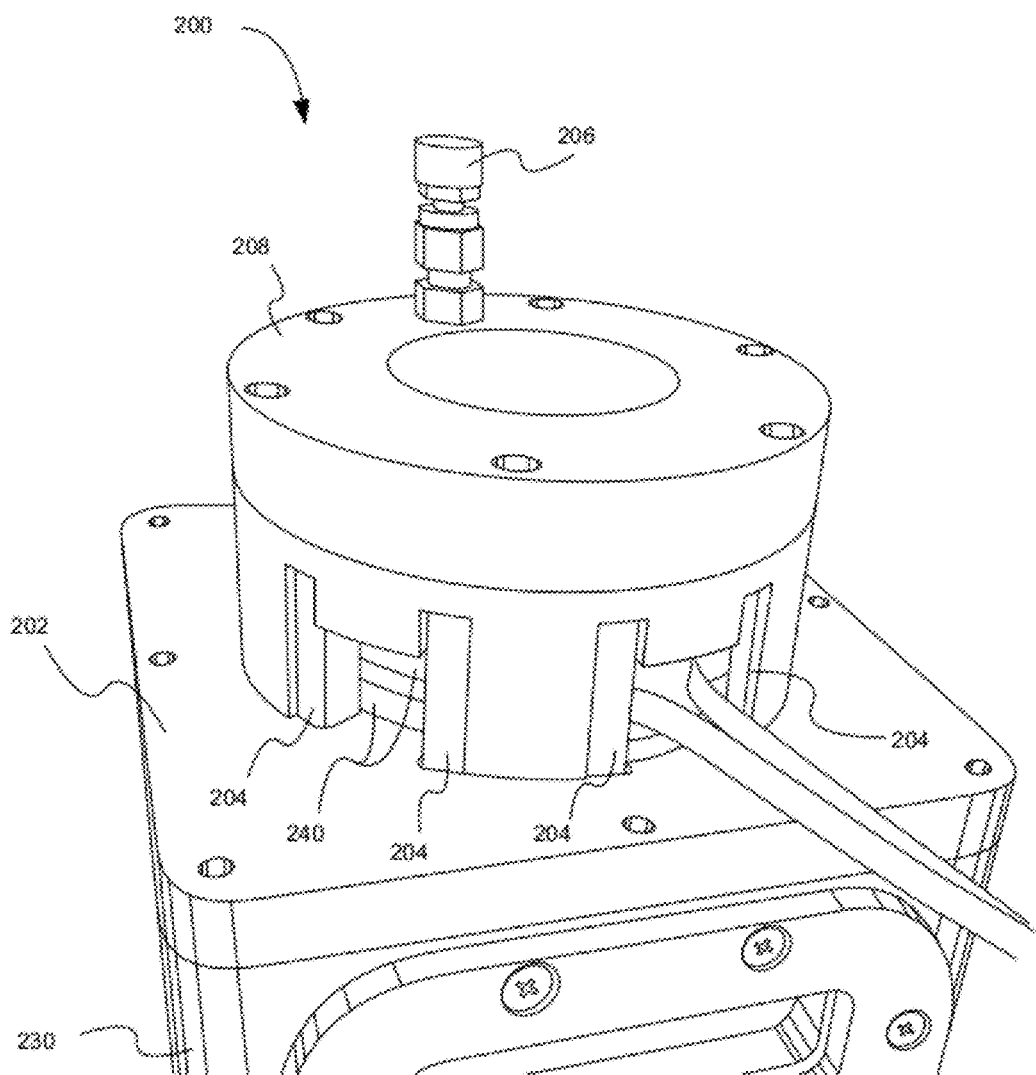
FIG. 2H is another perspective view of a plasma source mounted on a process chamber 230, in accordance with an embodiment of the present invention.

FIG. 2H is another perspective view of a plasma source 200 mounted on a process chamber 230, in accordance with an embodiment of the present invention. As shown in FIG. 2H, a primary conductor 240 is shown wrapped around the plasma chamber 210. The primary conductor 240 is the primary winding of an inductive element as will be described in more detail in FIG. 7 below. The primary conductor 240 has one or more turns around the plasma chamber 210. As shown here, the primary conductor 240 has two turns around the plasma chamber 210, however more than two turns could also be used.

FIG. 3A is a perspective view of another plasma source 300, in accordance with an embodiment of the present invention. The plasma source 300 includes plasma chamber 210 having multiple ferrite elements 204 surrounding the plasma chamber at selected intervals. In this instance the ferrite elements 204 surrounding the plasma chamber at substantially equal intervals but they could be at different intervals.

The plasma chamber 210 can be roughly circular or geometrically shaped, such as in this instance, having five sides. Similarly, the plasma chamber 210 could be circular or three or more sided geometrical shapes. It should also be noted that the plasma chamber 210 could have an approximately rectangular or approximately circular or rounded cross-sectional shape. The inner surfaces of the plasma chamber 210 can be smoothed and without any sharp (e.g., about perpendicular or more acute angle) edges or corners. By way of example, the inner corners can have a rounded contour with a relatively large radius (e.g. between about ½ and about twice the radius of a cross-section of the plasma chamber). It should also be noted that while a single process gas inlet 206 is shown coupled to the plasma chamber 210, two or more process gas inlet's could be used to supply process gas to the plasma chamber.

Figure 3B:
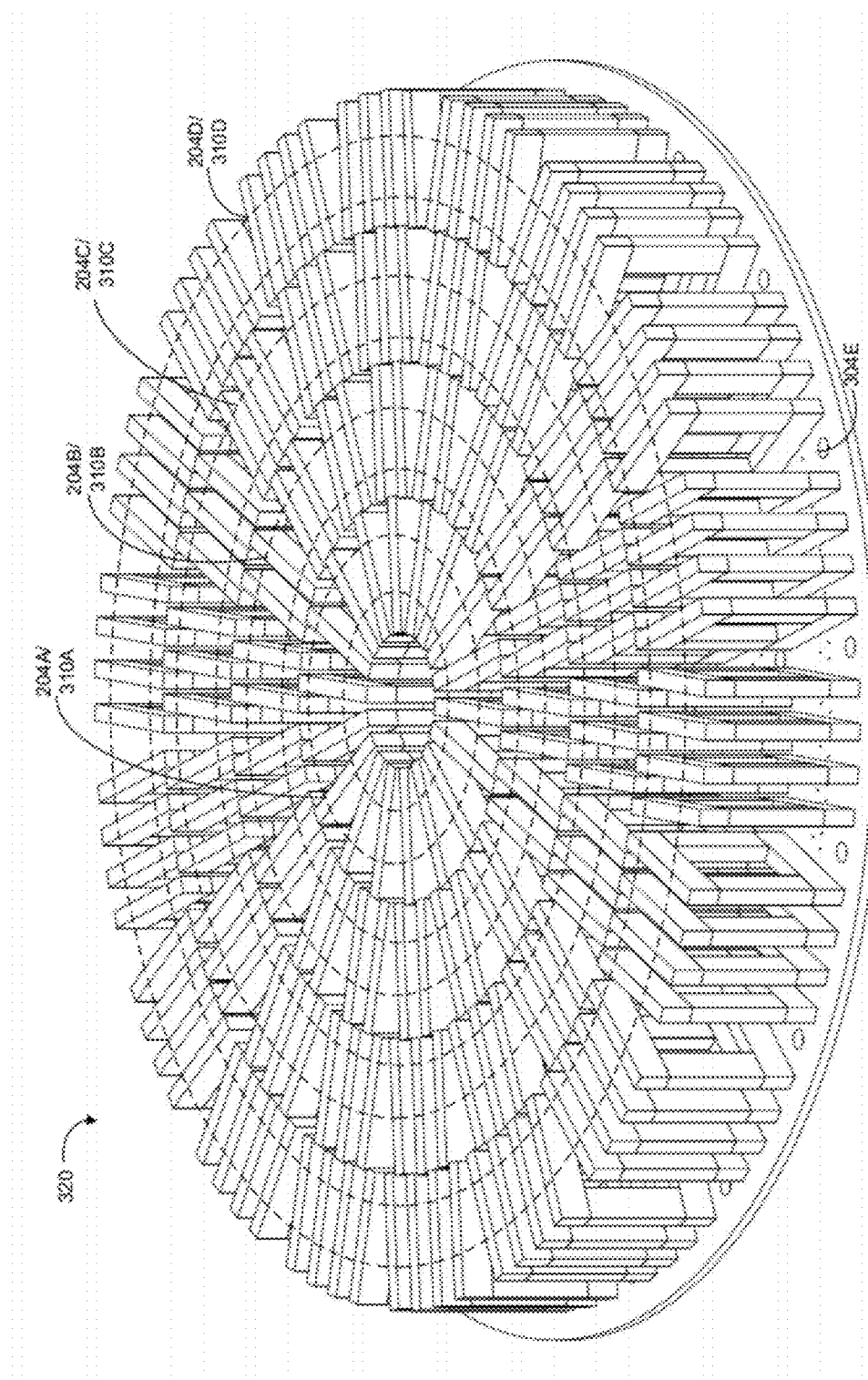
FIG. 3B is a top perspective view of a multizone plasma source, in accordance with an embodiment of the present invention.

FIG. 3B is a top perspective view of a multizone plasma source 320, in accordance with an embodiment of the present invention. The multizone plasma source 320 includes multiple, individual, concentric plasma chambers 310A-310D, e.g., in nested rings. Each of the concentric plasma chambers 310A-310D has a corresponding set of ferrites 204A-204D.

FIG. 3C is a bottom perspective view of multizone plasma source 320, in accordance with an embodiment of the present invention. The chamber top 202 has multiple process outlet ports 304A-304E and multiple plasma outlet ports 220A-220D. The multiple plasma outlet ports 220A-220D are coupled to corresponding plasma chambers 310A-310D.

Figure 3D:
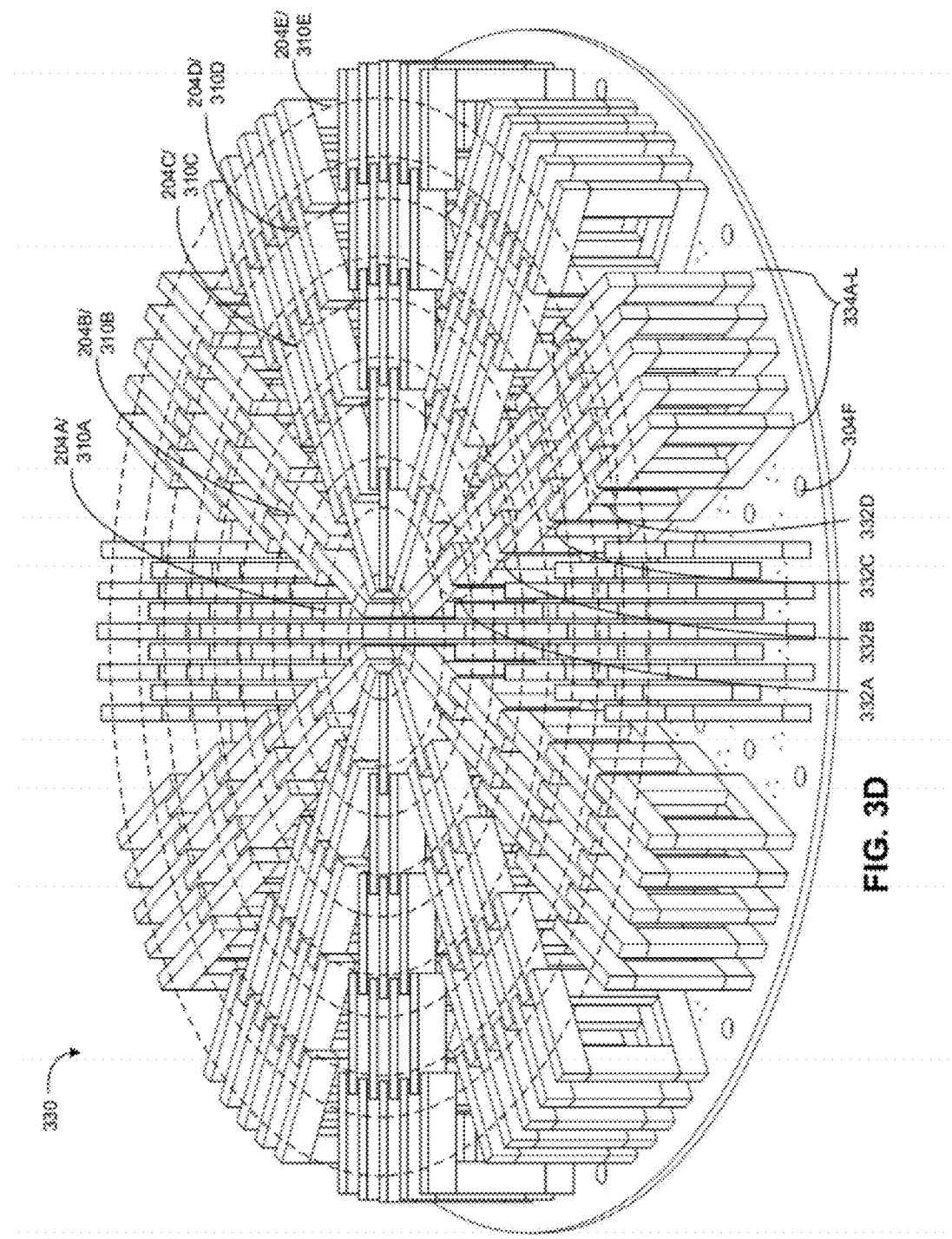
FIG. 3D is a top perspective view of another multizone plasma source, in accordance with an embodiment of the present invention.

FIG. 3D is a top perspective view of another multizone plasma source 330, in accordance with an embodiment of the present invention. FIG. 3E is a bottom perspective view of multizone plasma source 330, in accordance with an embodiment of the present invention. The multizone plasma source 330 includes multiple concentric plasma chambers 310A-310E. Each of the concentric plasma chambers 310A-310E has a corresponding set of ferrites 204A-204E.

As shown the ferrites 204A-204E of adjacent plasma chambers 310A-310E can overlap slightly as shown in regions 332A-332D. By way of example, inner edges of ferrites 204B overlap the outer edges of ferrites 204A in region 332A. Similarly, outer edges of ferrites 204B overlap the inner edges of ferrites 204C in region 332B. The overlapping ferrites 204A-204E allow the concentric plasma chambers 310A-310E to be more closely packed in the multizone plasma source 330. Thus allowing more concentric rings 310A-310E (e.g., five concentric rings) to be included in the same diameter as non-overlapping ferrite embodiment shown in FIGS. 3B and 3C having only four concentric rings 310A-310D. As will be described below, each ring 310A-310E can be individually controlled in bias, gas flow, concentration, RF power, etc. Thus, a greater number of concentric rings 310A-310E provides a more fine tuning control of the process across the diameter of the substrate 102 in the process chamber 230.

The ferrites 204A-204E can optionally be arranged in multiple radial segments (i.e., pie slice shapes) 334A-334L of the multizone plasma source 330. As will be described below, each radial segment 334A-334L can be individually controlled in bias, gas flow, concentration, etc. Thus, the radial segments 334A-334L provide yet another fine tuning control of the process radially across the substrate 102 in the process chamber 230.

Figure 4A:
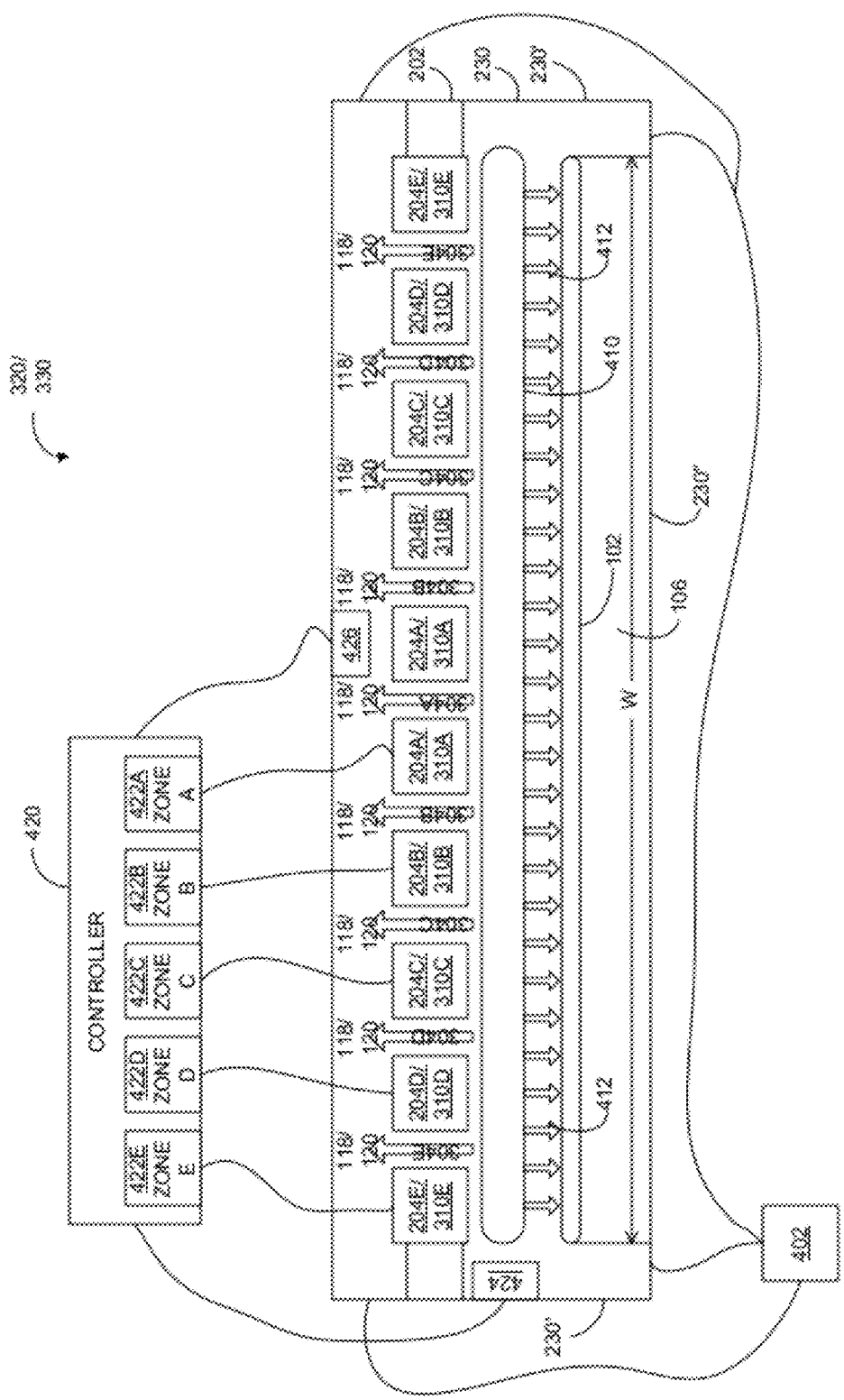
FIGS. 4A and 4B are simplified schematic views of multizone plasma sources, in accordance with an embodiment of the present invention.
Figure 4B:
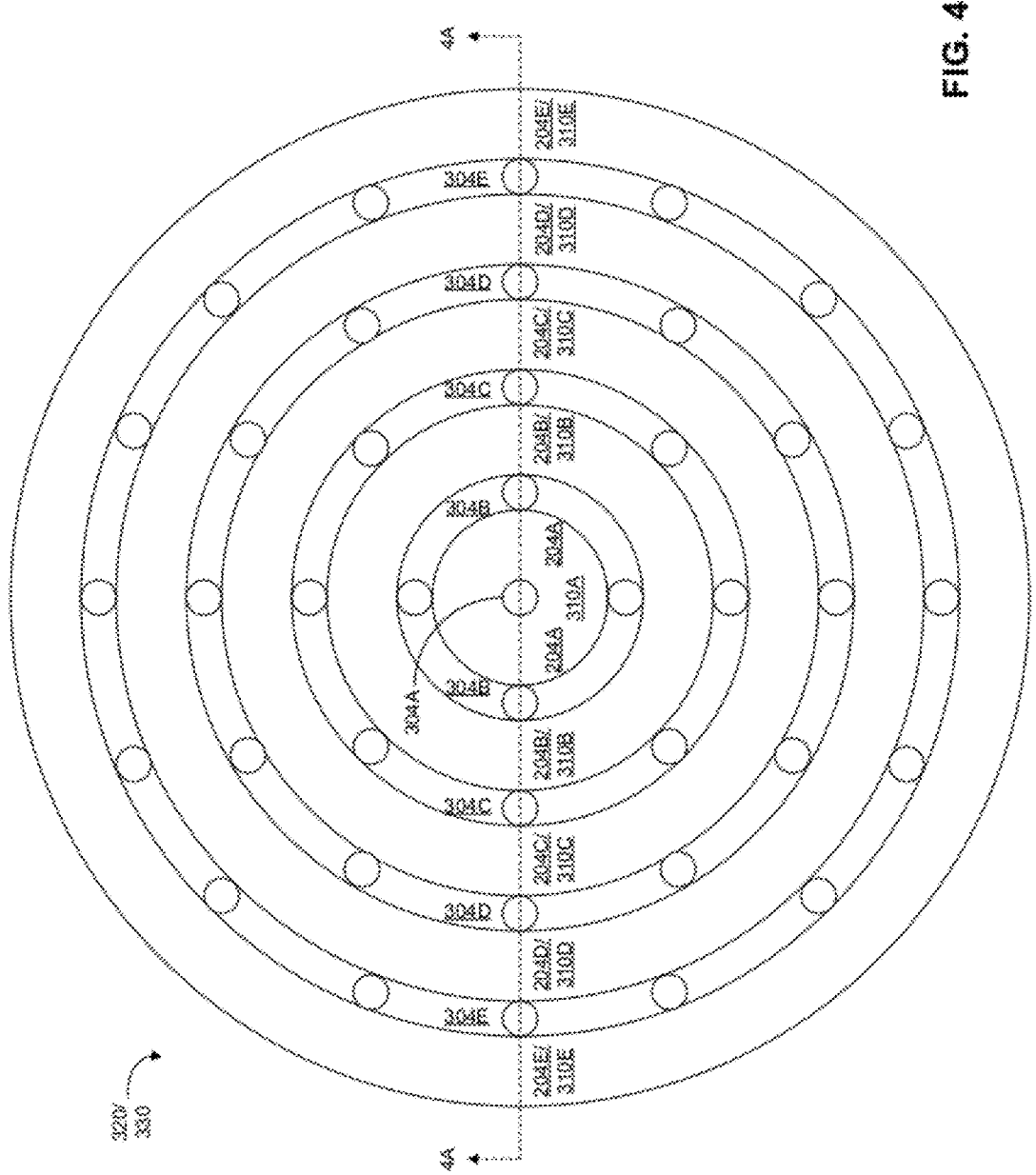

FIGS. 4A and 4B are simplified schematic views of multizone plasma sources 300, 320, in accordance with an embodiment of the present invention. The chamber top 202 includes the multizone plasma sources 300, 320. The process chamber 230 has sidewalls 230' and base 230". The substrate support 106 is on or near or proximate to the base 230". The process outlet ports 304A-304E withdraw the plasma byproducts 118 and recombination products 120 substantially equally across the width W of the substrate 102. As a result, the plasma byproducts 118 and recombination products 120 do not interfere with the plasma 410 and the neutral species 412 generated by the plasma. The neutral species 412 are therefore substantially evenly distributed across the width of the substrate 102. The neutral species 412 react with the surface of the substrate 102. As the neutral species 412 are substantially evenly distributed across the width of the substrate 102, the center-to-edge non-uniformities of the plasma processes (e.g., etch, strip or other plasma processes) applied in the processing chamber 230 are also substantially eliminated.

A controller 420 includes corresponding controls 422A-422E (e.g., software, logic, set points, recipes, etc.) for each ring 310A-310E. Process monitoring sensors 424, 426 can also be coupled to the controller 420 to provide a process feedback. The controls 422A-422E can individually control each ring 310A-310E such as a bias signal, power, frequency, process gas 110 pressures, flow rates and concentrations. Thus providing a radial profile control of dissociated gas across the diameter of the substrate 102 in the process chamber 230.

Each of the multiple plasma chambers 310A-310E can be controlled independently to manipulate the processes in the corresponding region of the processing chamber 230.

Similarly, each of the multiple radial segments 334A-334L allows each radial segment of the multiple plasma chambers 310A-310E to be controlled independently to manipulate the processes in the corresponding region of the processing chamber 230. By way of example, a process variable set point for the flow rate and pressure of the process gas 110 in the plasma chamber 310B is input to the corresponding control 422B. At least one of the process monitoring sensors 424, 426 provides a process measurement input to the corresponding control 422B. Based on the process measurement input from the process monitoring sensors 424, 426 and the logic and software, the corresponding control 422B then outputs revised setpoints for the RF power to ferrites 310B and the flow rate and the pressure of the process gas 110 in the plasma chamber 310B.

Similarly, the processes can be monitored and/or controlled in each of the respective regions defined by one or more or a combination of the concentric ring plasma chambers 310A-E, and/or the ferrites 204A-E, and/or the radial segments 334A-334L of the multizone plasma sources 200, 300, 310, 320, 330. It should also be understood that each of the zones could be operated in the same manner and setpoints so that the multizone plasma sources 200, 300, 310, 320, 330 are effectively a single zone plasma source. Further, some of the zones of the multizone plasma sources 200, 300, 310, 320, 330 can be operated in the same manner and setpoints so that the multizone plasma sources have less zones.

Figure 5:
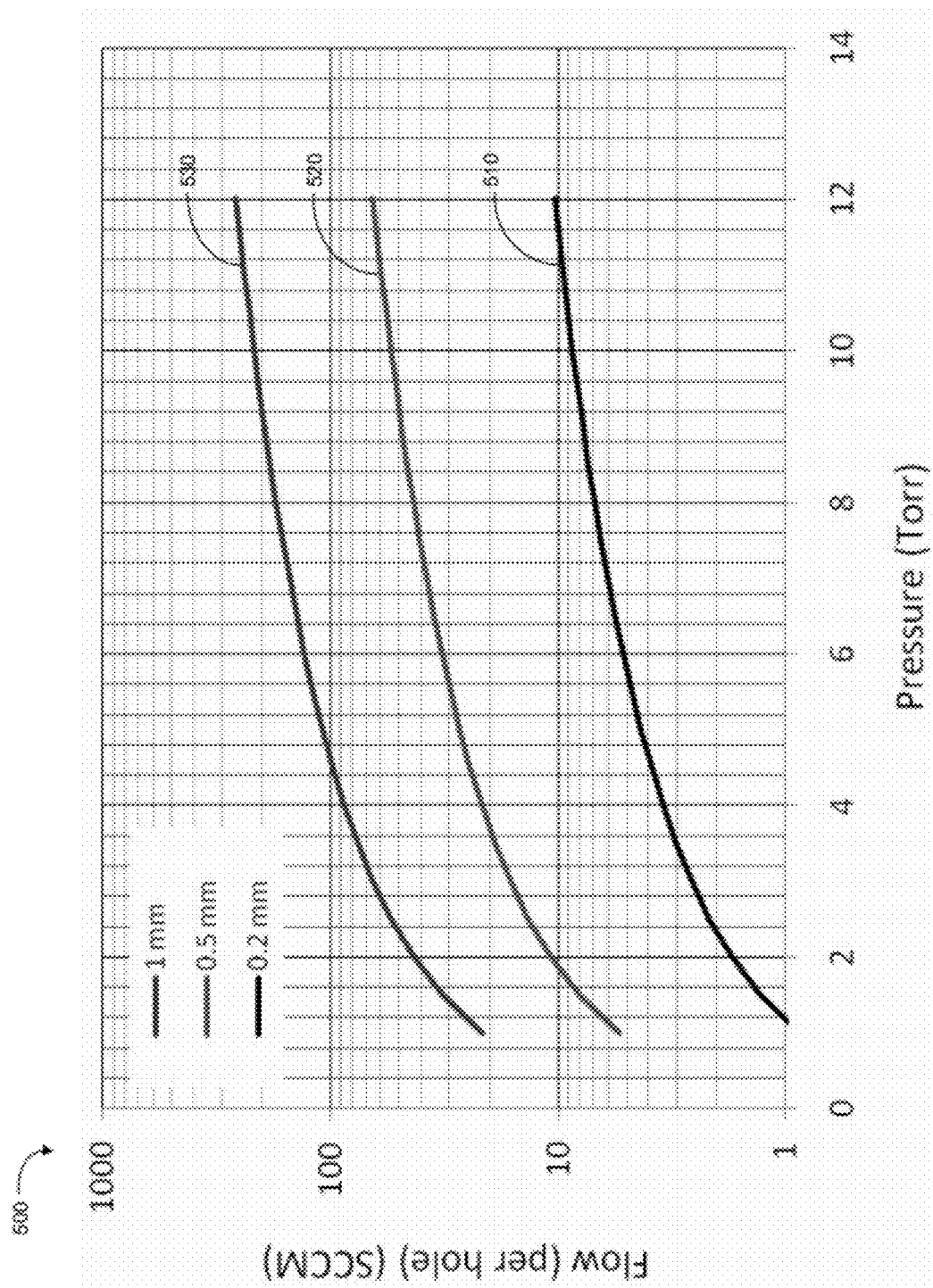
FIG. 5 is a flow and pressure graph for various sizes of the optional plasma restriction, in accordance with an embodiment of the present invention.

FIG. 5 is a flow and pressure graph for various sizes of the optional plasma restriction 214, in accordance with an embodiment of the present invention. Graph 510 is the flow rate in standard cubic centimeters per minute (SCCM) for an optional plasma restriction 214 having a diameter of 0.2 mm. Graph 520 is the flow rate for an optional plasma restriction 214 having a diameter of 0.5 mm. Graph 530 is the flow rate for an optional plasma restriction 214 having a diameter of 1.0 mm. As can be seen, the various sizes of the optional plasma restriction 214 can determine a pressure drop between the plasma chamber 210 and the process chamber 230. If the pressure drop is such that choked flow occurs across the plasma restriction 214, the mass flow rate into the process chamber 210 will not increase with a decrease in the plasma chamber when pressure in the plasma chamber 210 is constant.

Increasing the pressure in the plasma chamber 210 provides the density of the process gas 110 sufficient to support a plasma in the plasma chamber. For a fixed RF voltage, the current required to be induced into the process gas 110 is inversely proportional to the process gas pressure. Therefore, increasing the process gas 110 pressure in the plasma chamber 210 reduces the current required to produce the plasma. Further, since the plasma requires the process gas pressure to support the plasma, then the plasma will be contained in the plasma chamber 210 and will not flow from the plasma chamber into the process chamber 230. As a result, the plasma restriction 214 can restrict the plasma to the plasma chamber 210.

A transformer has a primary winding and a secondary winding. A primary current through the primary winding generates a magnetic field. As the magnetic field passes through the secondary winding, a corresponding secondary current is induced into the secondary winding. A transformer with a ferrite core, concentrates (i.e., focuses) the magnetic field to a smaller, denser magnetic field and therefore more efficiently induces the secondary current into the secondary winding. This allows for very efficient low frequency operation (e.g., less than about 13 MHz and more specifically between 10 kHz and less than about 5 MHz and more specifically between about 10 kHz and less than about 1 MHz). The low frequency operation also provides significantly lower cost relative to typical high frequency RF plasma systems (e.g., about 13.56 MHz and higher frequencies).

A further advantage of low frequency ferrite coupled plasma systems is their low ion bombardment energies, which results in less plasma erosion and fewer on-wafer particulates relative to a high-frequency RF system. Less plasma erosion results in less wear and tear on the plasma chamber 210 surfaces and components.

Figure 6B:
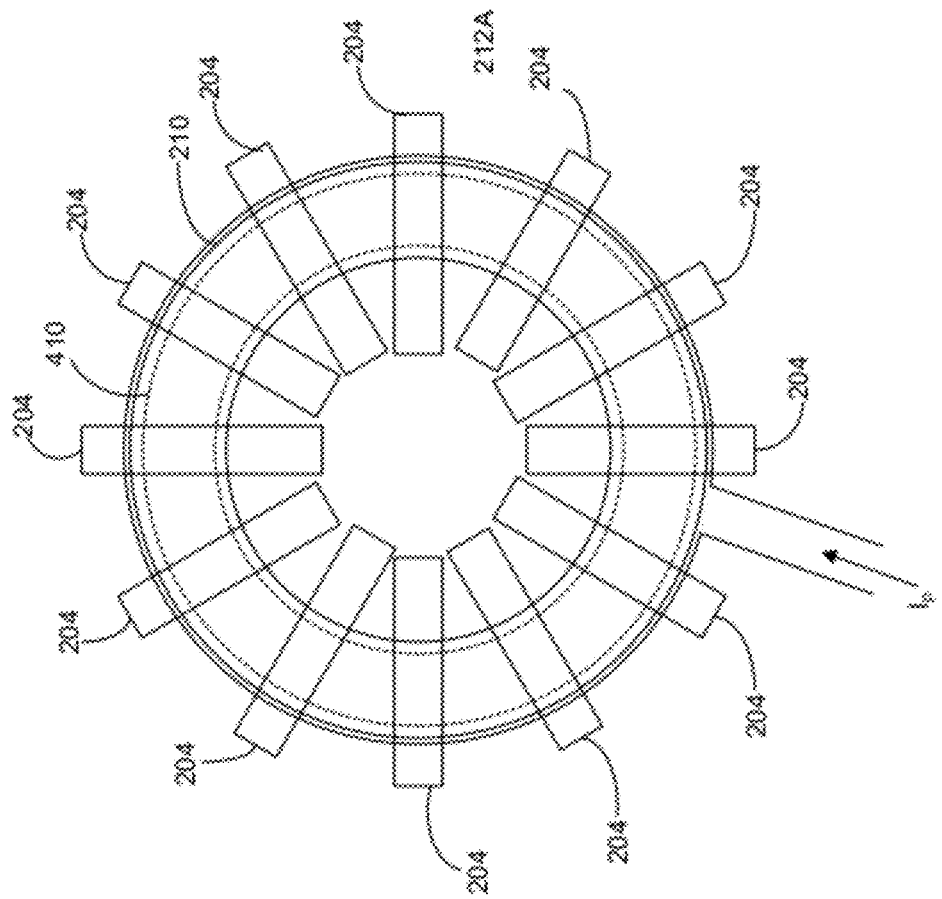
FIG. 6B is a schematic of a single ring of ferrites and plasma chamber in a plasma source, in accordance with an embodiment of the present invention.
Figure 6A:
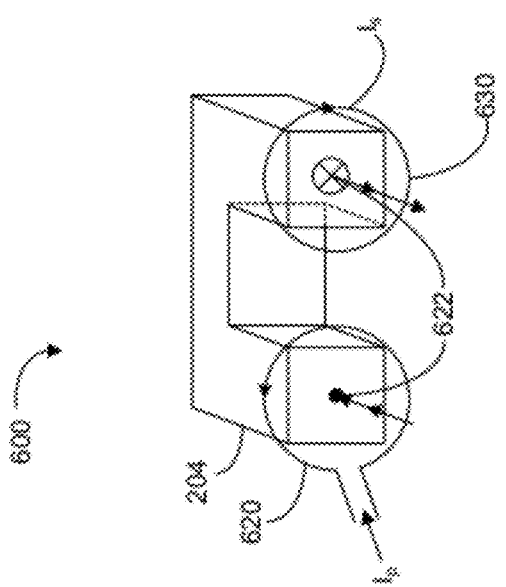
FIG. 6A is a schematic of an exemplary transformer, in accordance with an embodiment of the present invention.

FIG. 6A is a schematic of an exemplary transformer 600, in accordance with an embodiment of the present invention. A primary current $I_p$ is applied to the primary winding 620 from a power supply. The flow of the primary current $I_p$ through the primary winding 620 produces a magnetic field 622 into the ferrite 204. The magnetic field 622 emerges from the ferrite in the center of the secondary winding 630 and induces a secondary current $I_s$ in the secondary winding.

Figure 7:
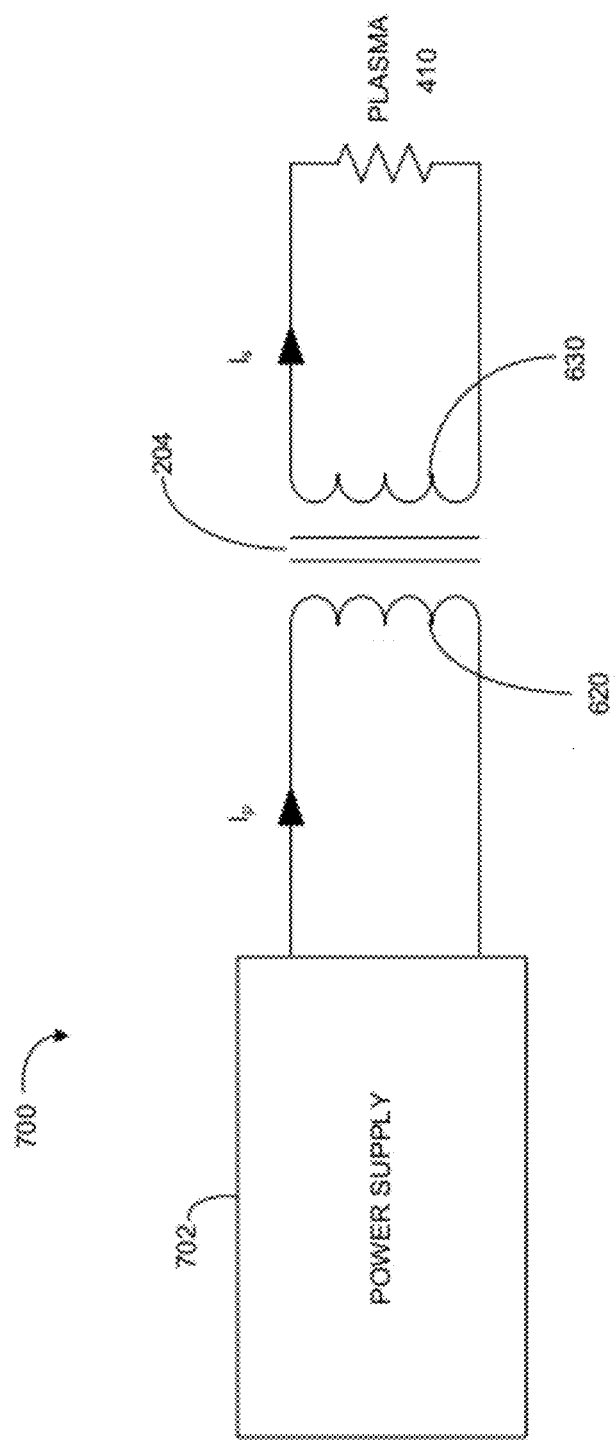
FIG. 7 is an electrical schematic of a single ring of ferrites and plasma chamber in a multizone plasma source, in accordance with an embodiment of the present invention

FIG. 6B is a schematic of a single ring of ferrites 204 and plasma chamber 210 in a plasma source 200, 300, 310, 320, 330, in accordance with an embodiment of the present invention. FIG. 7 is an electrical schematic 700 of a single ring of ferrites 204 and plasma chamber 210 in a plasma source 200, 300, 310, 320, 330, in accordance with an embodiment of the present invention. In the plasma sources 200, 300, 310, 320, 330, described herein, the primary winding 240 is wrapped around each plasma chamber 210 and inside each respective set of ferrites 204, 204A-E. The secondary winding is the process gas 110 inside the plasma chamber 210.

A primary current $I_p$ is applied to the primary winding 240 from a power supply 702. The power can be RF (e.g., about 10 kHz to about 1 MHz or more or between about 10 kHz to about 5 MHz or between about 10 kHz to less than about 13 MHz). The flow of the primary current $I_p$ through the primary winding 240 produces a magnetic field 622 in the ferrites 204. The magnetic field 622 induces a secondary current $I_s$ in the process gas 110 inside the plasma chamber 210. As a result, the process gas is excited sufficiently to form a plasma 410.

Figure 8:
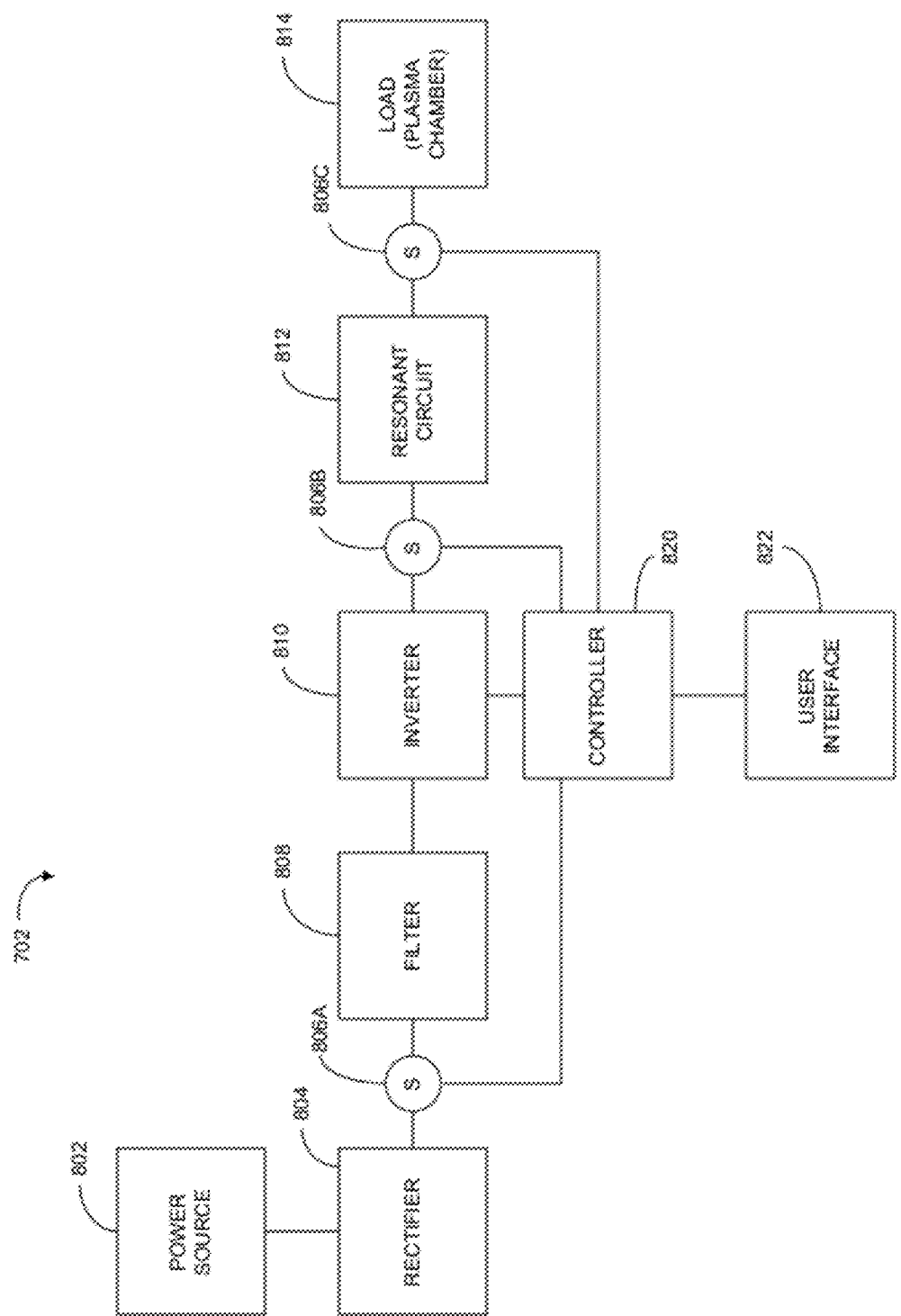
FIG. 8 is an electrical schematic of a power supply, in accordance with an embodiment of the present invention.

FIG. 8 is an electrical schematic of a power supply 702, in accordance with an embodiment of the present invention. The power supply 702 includes a rectifier 804 for converting the AC power from the power source 802 into a DC power. The filter 808 filters the output of the rectifier 804. The filtered DC is delivered to the inverter 810 from the filter 808. The inverter 810 converts the filtered DC to an AC signal at the desired frequency, voltage and current. A resonant circuit 812 matches resonance with the plasma chamber load 814 so as to efficiently deliver the desired AC signal to the load in resonance.

A controller 820 controls the power supply 702. The controller 820 includes a user interface 822 that may include a link (e.g., network) to a system controller or a larger area control system (not shown). The controller 820 is coupled to the Components 804, 808, 810, 812 directly and via sensors 806A, 806B, 806C for monitoring and controlling the operation thereof. By way of example the controller 820 monitors one or more of the voltage, current, power, frequency and phase of the power signals within the power supply 702.

Figure 9A:
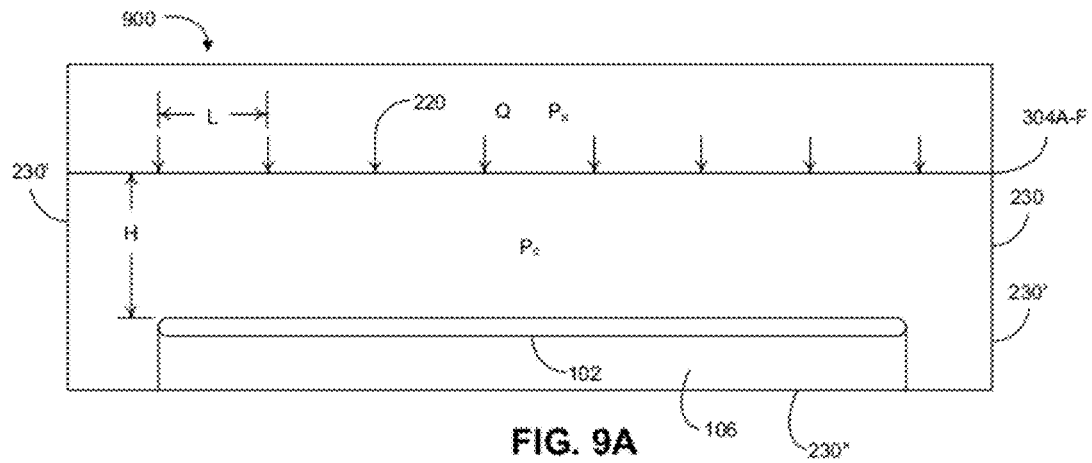
FIGS. 9A-9C are flow diagrams of the flow from the plasma source, in accordance with an embodiment of the present invention.
Figure 9B:
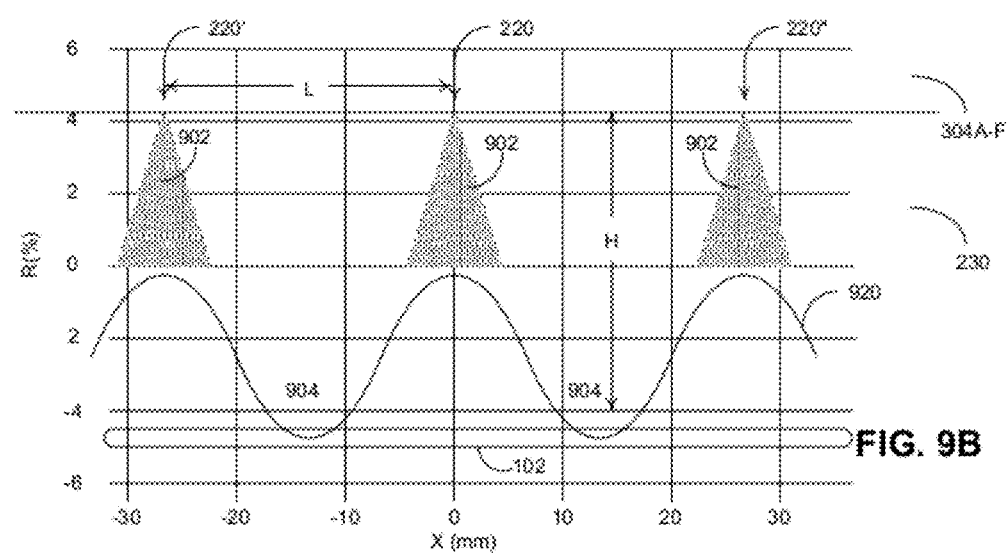
Figure 9C:
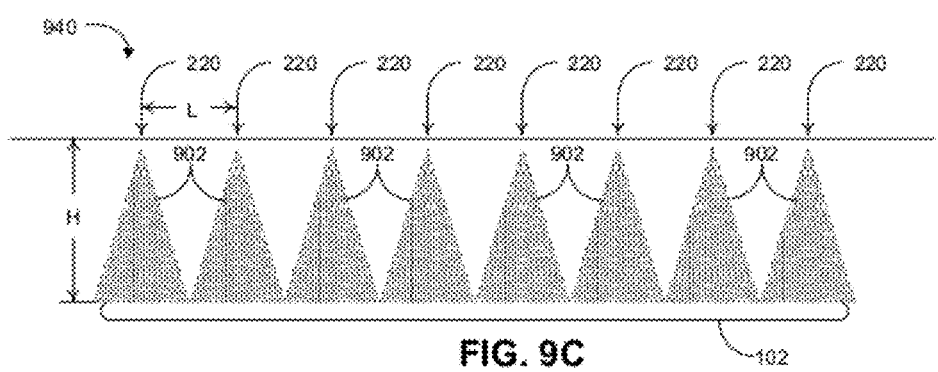

FIGS. 9A-9C are flow diagrams of the flow from the plasma source 300, 310, 320, 330, in accordance with an embodiment of the present invention. The radicals and neutrals flow 902 are shown flowing from the plasma chamber 304A-F toward a substrate 102 in an approximant fan shape. The fan shape begins at the outlet ports 220 and expands as it approaches the wafer 102. The gas flowing through the plasma chamber 304A-F has a flowrate Q and a pressure Ps. The pressure Pc is the pressure in the process chamber 230. The difference between Ps and Pc allows the radicals and neutrals flow 902 to expand toward the wafer 102.

Referring now to FIG. 9B, the concentration 920 of the radicals and neutrals flow 902 is a function of the distance L between the outlet ports 220 and the height H of the process chamber 230. If the distance L between the outlet ports 220 is too great then there will be regions 904 where the concentration 920 of the radicals and neutrals flow 902 is insufficient to react with the surface of the wafer 102. Similarly, if the height H of the process chamber 230 is too small, then there will be regions 904 where the concentration 920 of the radicals and neutrals flow 902 is insufficient to react with the surface of the wafer 102. FIG. 9C shows an ideal relationship of Height H and distance L as follows:

$$R = R(x, H, L)$$
$$\text{Where: } R(x) = (n_{total} - n_0)/n_0$$
$$\text{and } n_{total}(x) = \sum_i n_i$$

If distance L is approximately equal to height H/2 the variation of concentration of the radicals and neutrals across the surface of the wafer can be minimized Alternatively, increasing or decreasing the relationship of distance L and height H can allow variation in concentration of the radicals and neutrals across the surface of the wafer.

Figure 10:
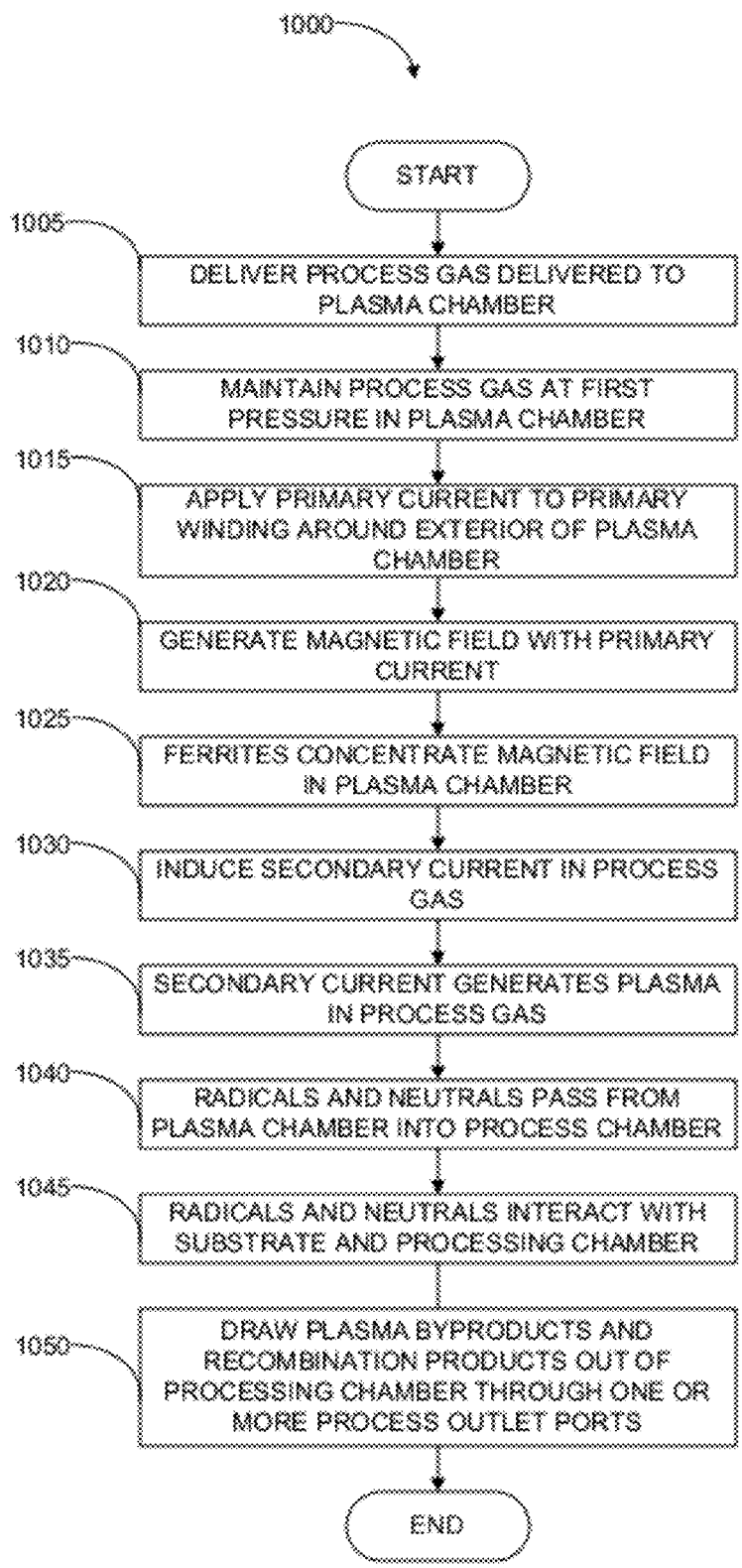
FIG. 10 is a flowchart diagram that illustrates the method operations performed in operation of the plasma sources described herein, in accordance with one embodiment of the present invention.

FIG. 10 is a flowchart diagram that illustrates the method operations performed in operation of the plasma source 200, 300, 310, 320, 330, in accordance with one embodiment of the present invention. The operations illustrated herein are by way of example, as it should be understood that some operations may have sub-operations and in other instances, certain operations described herein may not be included in the illustrated operations. With this in mind, the method and operations 1000 will now be described.

In an operation 1005, a process gas 110 is delivered to a plasma chamber 210. In an operation 1010, the process gas 110 is maintained at a first pressure in the plasma chamber 210. The first pressure can be the same as or up to twice or more multiples of a pressure of a process chamber 230 coupled to a set of outlet ports 220 of the plasma chamber.

In an operation 1015, a primary current $I_p$ is applied to a primary winding 240 wrapped around the external circumference of the plasma chamber 210. In an operation 1020, the primary current $I_p$ generates a magnetic field. In an operation 1025, one or more ferrites 204 concentrate the magnetic field to the approximate center portion of the plasma chamber 210. The ferrites 204 are formed around the plasma chamber 230.

In an operation 1030, the magnetic field induces a secondary current $I_s$ in the process gas 110 in the plasma chamber 210. In an operation 1035, the secondary current $I_s$ generates a plasma in the process gas 110 in the plasma chamber 210. In an operation 1040, a portion of the plasma and plasma generated radicals and neutrals pass from the plasma chamber 210 through the plasma chamber outlets 220 and into the process chamber 230.

In an operation 1045, the radicals and neutrals interact with a substrate 102 and the processing chamber 230 to produce plasma byproducts 118 and recombination products 120. In an operation 1050, the plasma byproducts 118 and the recombination products 120 are drawn out of the processing chamber through one or more process outlet ports 304A-304E. The one or more process outlet ports 304A-304E are distributed across the surface of the process chamber top 202 or along the edges of the substrate support 106 or below the substrate support such as in the base of the process chamber or combinations thereof and the method operations can end.

Figure 11:
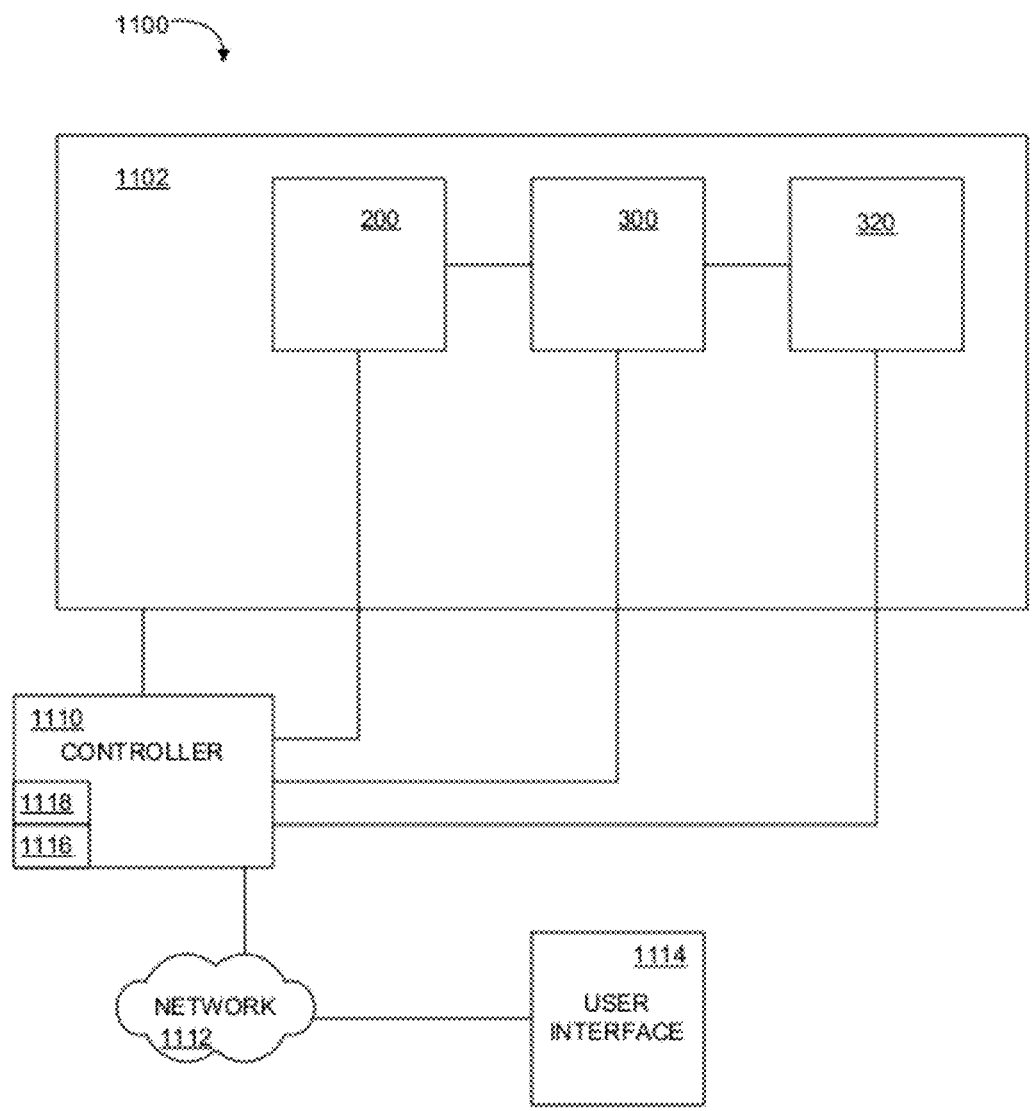
FIG. 11 is a block diagram of an integrated system including one or more of the plasma sources described herein, in accordance with an embodiment of the present invention.

FIG. 11 is a block diagram of an integrated system 1100 including the plasma sources 200, 300, 320, in accordance with an embodiment of the present invention. The integrated system 1100 includes the plasma sources 200, 300, 320, and an integrated system controller 1110 coupled to the plasma sources. The integrated system controller 1110 includes or is coupled to (e.g., via a wired or wireless network 1112) a user interface 1114. The user interface 1114 provides user readable outputs and indications and can receive user inputs and provides user access to the integrated system controller 1110.

The integrated system controller 1110 can include a special purpose computer or a general purpose computer. The integrated system controller 1110 can execute computer programs 1116 to monitor, control and collect and store data 1118 (e.g., performance history, analysis of performance or defects, operator logs, and history, etc.) for the plasma sources 200, 300, 320. By way of example, the integrated system controller 1110 can adjust the operations of the plasma sources 200, 300, 320 and/or the components therein (e.g., the one of the concentric ring plasma chambers 310A-E or ferrites 204, 204A-E, etc.) if data collected dictates an adjustment to the operation thereof.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma source comprising:
    a plurality of ring plasma chambers disposed on a processing chamber top opposite from a processing chamber, each one of the plurality of ring plasma chambers being having a ring shape oriented parallel to the processing chamber top, each one of the plurality of ring plasma chambers not passing through the processing chamber top, wherein each one of the plurality of plasma chambers includes corresponding plurality of plasma chamber outlets coupling each one of the plurality the plasma chambers to the process chamber, each one of the plurality of plasma chamber outlets passing through the process chamber top each one of the plurality of plasma chamber outlets including a plasma restriction sized to prevent plasma from passing from the plasma chamber to the processing chamber;
    a plurality of primary windings, wherein each one of the plurality of primary windings is wrapped around an exterior one of the plurality of the ring plasma chambers; and
    a plurality of ferrites disposed in a plurality of groups, wherein each one of the plurality of the ring plasma chamber passes through a respective one of the plurality of groups of the ferrites.

2. The plasma source of claim 1, further comprising a control system coupled to each of the plurality of ring plasma chambers.

3. The plasma source of claim 1, wherein the plurality of ring plasma chambers are substantially concentric and wherein each one of the plurality of groups of the ferrites are substantially concentric.

4. The plasma source of claim 1, wherein each one of the plurality of ring plasma chambers are adjacent to at least another one of the plurality of ring plasma chambers.

5. The plasma source of claim 1, further comprising at least one process gas inlet coupling a process gas source to each one of the plurality the plasma chambers.

6. The plasma source of claim 1, wherein the ferrites are substantially evenly distributed around the circumference of the corresponding one of the plurality of ring plasma chambers.

7. The plasma source of claim 1, wherein the ferrites are disposed in a plurality of groups around the circumference of each of the plurality of ring plasma chambers.

8. The plasma source of claim 1, wherein the ring plasma chamber is one of a group of shapes consisting of substantially round, substantially triangular, substantially rectangular, or substantially polygonal shape.

9. The plasma system of claim 1, further comprising a power supply coupled to each one of the plurality of primary windings and providing a primary current along the plurality of primary windings and inducing a secondary current in a process gas inside the plasma chamber.

10. The plasma source of claim 1, wherein each one of the plurality of plasma chambers includes:
    at least one process gas inlet, the least one process gas inlet coupled to a process gas source and a process gas plenum; and
    a plurality of inlet ports coupled between the process gas plenum and the respective one of the plurality of plasma chambers.

11. The plasma source of claim 10, wherein the plurality of inlet ports are distributed around the circumference of each one of the plurality of plasma chambers.

12. A plasma processing system comprising:
    a plurality of ring plasma chambers disposed on a processing chamber top opposite from a processing chamber, each one of the plurality of ring plasma chambers having a ring shape oriented parallel to the processing chamber top, each one of the plurality of ring plasma chambers not passing through the processing chamber top, wherein each one of the plurality of plasma chambers includes corresponding plurality of plasma chamber outlets coupling each one of the plurality the plasma chambers to the process chamber, each one of the plurality of plasma chamber outlets passing through the process chamber top each one of the plurality of plasma chamber outlets including a plasma restriction sized to prevent plasma from passing from the plasma chamber to the processing chamber;

a plurality of primary windings, wherein each one of the plurality of primary windings is wrapped around an exterior one of the plurality of the ring plasma chambers;

a plurality of ferrites disposed in a plurality of groups, wherein each one of the plurality of the ring plasma chamber passes through a respective one of the plurality of groups of the ferrites; and a control system coupled to each of the plurality of ring plasma chambers, the control system including:
    at least one process monitoring sensor; and
    logic for delivering a process gas into each one of the plurality of ring plasma chambers;
    logic for applying a primary current to a respective primary winding around a corresponding exterior of each one of the plurality of ring plasma chambers;
    logic for generating magnetic field in each of the primary windings;
    logic for concentrating the magnetic field with the plurality of ferrites, wherein the ferrites are in a plurality of groups around the circumference of each of the plurality of ring plasma chambers;
    logic for inducing a secondary current in the process gas in each of the plurality of ring plasma chambers;
    logic for generating a plasma in the process gas in each of the plurality of ring plasma chambers with the secondary current;
    logic for receiving a process feedback signal from at the least one process monitoring sensor; and
    logic for adjusting at least one set point.

13. The plasma system of claim 12, further comprising a power supply coupled to each one of the plurality of primary windings and providing a primary current along the plurality of primary windings and inducing a secondary current in a process gas inside the plasma chamber.

14. A plasma system for processing a substrate, comprising:

a process chamber having:
    a base;
    a plurality of sidewalls;
    a substrate support proximate to the base; and
    a chamber top interfaced with the sidewalls to enclose the process chamber;

a plurality of ferrites disposed over the chamber top in a plurality of groups-distributed over regions of the substrate support, the regions extending at least between an exterior portion of the substrate support and a center portion of the substrate support wherein the plurality of ferrites are grouped in a plurality of groups of one or more ferrites;

a plurality of primary windings, wherein each one of the plurality of primary windings is wrapped around an exterior one of the plurality of groups of ferrites; and a plurality of ring plasma chambers disposed on the chamber top opposite from the processing chamber, each one of the plurality of ring plasma chambers having a ring shape oriented parallel to the chamber top, wherein each one of the plurality of the ring plasma chamber passes through a respective one of the plurality of groups of the ferrites, each one of the plurality of ring plasma chambers not passing through the processing chamber top, wherein each one of the plurality of plasma chambers includes corresponding plurality of plasma chamber outlets coupling each one of the plurality the plasma chambers to the process chamber, each one of the plurality of plasma chamber outlets passing through the process chamber top each one of the plurality of plasma chamber outlets including a plasma restriction sized to prevent plasma from passing from the plasma chamber to the processing chamber.

15. The plasma system of claim 14, further comprising:

a power supply coupled to each one of the plurality of primary windings and providing a primary current along the plurality of primary windings, the plurality of ferrites concentrating the current over the regions of the substrate support.

16. The plasma system of claim 14, further comprising a power supply coupled to each one of the plurality of primary windings and providing a primary current along the plurality of primary windings and inducing a secondary current in a process gas inside the plasma chamber.

* * * * *